(12) United States Patent
Talapin et al.

(10) Patent No.: US 12,259,651 B2
(45) Date of Patent: *Mar. 25, 2025

(54) PHOTOSENSITIVE, INORGANIC LIGAND-CAPPED INORGANIC NANOCRYSTALS

(71) Applicant: The University of Chicago, Chicago, IL (US)

(72) Inventors: Dmitri V. Talapin, La Grange Park, IL (US); Yuanyuan Wang, Nanjing (CN); Jia-Ahn Pan, Chicago, IL (US); Haoqi Wu, Chicago, IL (US)

(73) Assignee: THE UNIVERSITY OF CHICAGO, Chicago, IL (US)

( * ) Notice: Subject to any disclaimer, the term of this patent is extended or adjusted under 35 U.S.C. 154(b) by 903 days.

This patent is subject to a terminal disclaimer.

(21) Appl. No.: 17/283,457

(22) PCT Filed: Oct. 11, 2019

(86) PCT No.: PCT/US2019/055784
§ 371 (c)(1),
(2) Date: Apr. 7, 2021

(87) PCT Pub. No.: WO2020/123021
PCT Pub. Date: Jun. 18, 2020

(65) Prior Publication Data
US 2022/0011664 A1  Jan. 13, 2022

Related U.S. Application Data

(60) Provisional application No. 62/897,748, filed on Sep. 9, 2019, provisional application No. 62/853,448, filed on (Continued)

(51) Int. Cl.
G03F 7/004 (2006.01)
G03F 7/008 (2006.01)
(Continued)

(52) U.S. Cl.
CPC .......... G03F 7/0042 (2013.01); G03F 7/0043 (2013.01); G03F 7/0045 (2013.01);
(Continued)

(58) Field of Classification Search
CPC ......... G03F 7/0042; G03F 7/043; G03F 7/022
See application file for complete search history.

(56) References Cited

U.S. PATENT DOCUMENTS 6,379,635 B2  4/2002  O'Brien et al.
7,294,449 B1 *  11/2007  Gudeman ............. G03F 7/0047
430/270.1
(Continued)

FOREIGN PATENT DOCUMENTS

CN  103450904 B  4/2016
CN  105992807 A  10/2016
(Continued)

OTHER PUBLICATIONS

Sean E. Doris et al., "Mechanistic Insight into the Formation of Cationic Naked Nanocrystals Generated under Equilibrium Control," *Journal of the American Chemical Society*, 2014, vol. 136; pp. 15702-15710.
(Continued)

*Primary Examiner* — John S. Chu
(74) *Attorney, Agent, or Firm* — Bell & Manning, LLC

(57) ABSTRACT

Ligand-capped inorganic particles, dispersions of the ligand-capped inorganic particles, and films composed of the ligand-capped inorganic particles are provided. Also provided are methods of patterning the films and electronic, photonic, and optoelectronic devices that incorporate the films. The ligands include bifunctional ligands and two-component ligand systems that include a photosensitive group, cation, or molecule.

18 Claims, 29 Drawing Sheets

Related U.S. Application Data on May 28, 2019, provisional application No. 62/746,710, filed on Oct. 17, 2018.

(51) Int. Cl.
    *G03F 7/20*     (2006.01)
    *G03F 7/30*     (2006.01)
    *G03F 7/32*     (2006.01)

(52) U.S. Cl.
    CPC ............... *G03F 7/008* (2013.01); *G03F 7/20* (2013.01); *G03F 7/32* (2013.01)

(56) References Cited

U.S. PATENT DOCUMENTS

| | | | |
|---|---|---|---|
| 9,346,998 B2 | 5/2016 | Talapin et al. | |
| 10,551,553 B2 | 2/2020 | Dubrow et al. | |
| 2007/0287096 A1* | 12/2007 | Ohsawa | G03F 7/40 430/270.1 |
| 2011/0059264 A1 | 3/2011 | Park et al. | |
| 2014/0346442 A1 | 1/2014 | Nag et al. | |
| 2015/0185616 A1 | 7/2015 | Cooper et al. | |
| 2015/0228866 A1 | 8/2015 | Daniels et al. | |
| 2015/0234272 A1 | 8/2015 | Sarma et al. | |
| 2017/0285477 A1* | 10/2017 | Tanigaki | G03F 7/0758 |
| 2018/0009659 A1 | 1/2018 | Naasani | |
| 2018/0011346 A1 | 1/2018 | Naasani | |
| 2018/0370800 A1 | 12/2018 | Smith et al. | |
| 2020/0172802 A1 | 6/2020 | Ahn et al. | |
| 2020/0249570 A1 | 8/2020 | Talapin et al. | |
| 2022/0011664 A1 | 1/2022 | Talapin et al. | |
| 2023/0341770 A1* | 10/2023 | Talapin | C09K 11/7716 |

FOREIGN PATENT DOCUMENTS

| | | |
|---|---|---|
| CN | 106032468 A | 10/2016 |
| CN | 108102640 A | 6/2018 |
| JP | 2015-157807 A | 9/2015 |
| JP | 2015-172741 A | 10/2015 |
| JP | 2018-502327 A | 1/2018 |
| KR | 2016-0103068 | 8/2016 |
| KR | 20160103068 A * | 8/2016 |
| WO | WO 2015/118346 A1 | 8/2015 |
| WO | WO 2016/102157 A1 | 6/2016 |

OTHER PUBLICATIONS

Evelyn L. Rosen et al., "Exceptionally Mild Reactive Stripping of Native Ligands from Nanocrystal Surfaces by Using Meerwein's Salt**," *Angew. Chem. Int. Ed.*, 2012, vol. 51; pp. 684-689.

Pang, Sin-Yi, et al. "Universal strategy for HF-free facile and rapid synthesis of two-dimensional MXenes as multifunctional energy materials," *Journal of the American Chemical Society*, vol. 141, No. 24 (2019); pp. 9610-9616.

Dong, Angang, et al., "A generalized ligand-exchange strategy enabling sequential surface functionalization of colloidal nanocrystals," *Journal of the American Chemical Society*, vol. 133, No. 4, (2011); pp. 998-1006.

Enomoto, Kazuyuki, et al., "Novel electron-beam-induced reaction of a sulfonium salt in the solid state," *Journal of Vacuum Science & Technology B: Microelectronics and Nanometer Structures Processing, Measurement, and Phenomena*, vol. 24, No. 5, (Sep./Oct. 2006); pp. 2337-2349.

Kazuki Kasahara et al., "Nanoparticle photoresist studies for EUV lithography," Extreme Ultraviolet (EUV) Lithography V11, edited by Eric M. Panning Kenneth A. Goldberg, Proc. of SPIE, vol. 10143, 1014305 © 2017 SPIE, CCC code: 0277-786X/17/$18, Doi: 10.1117/12.2258187.

Masamitsu Shirai, "Non-ionic Photoacid Generators for i-Line: Synthesis, Photochemistry and Application to Photocrosslinking System," Department of Applied Chemistry, Osaka Prefecture University; pp. 1-8.

Choi, Ji-Hyuk, et al., "Exploiting the colloidal nanocrystal library to construct electronic devices," *Science*, vol. 352, Issue 6282, (Apr. 8, 2016); pp. 205-208.

Subramani, Chandramouleeswaran et al. "Direct photopatterning of light-activated gold nanoparticles," *Journal of Materials Chemistry*, vol. 21, No. 37, (2011); pp. 14156-14158. Accepted May 4, 2011. DOI: 10.1039/c1jm11035g.

Kim, Won Jin, et al. "Photothermal-reaction-assisted two-photon lithography of silver nanocrystals capped with thermally cleavable ligands," *Applied Physics Letters*, vol. 98, No. 13, (2011); pp. 133110.

Brutchey et al., "Nanocrystal ligand exchange with 1, 2, 3, 4-thiatriazole-5-thiolate and its facile in situ conversion to thiocyanate," *Dalton Transactions*, vol. 41, Issue. 26, (2012); pp. 7835-7838.

Kim, Won Jin et al. "Robust microstructures using UV photopatternable semiconductor nanocrystals," *Nano Letters*, vol. 8, No. 10, (2008); pp. 3262-3265. Includes Supporting Information.

Lu, C. H. et al. "Fabrication and characterization of stable ultrathin film micropatterns containing CdS nanoparticles," *Advanced Functional Materials*, vol. 13, No. 7, (2003); pp. 548-552.

Jun, Shinae et al. "Photopatterned semiconductor nanocrystals and their electroluminescence from hybrid light-emitting devices," *Langmuir*, vol. 22, No. 6, (2006); pp. 2407-2410.

Park, Jong-Jin et al. "Photopatternable quantum dots forming quasi-ordered arrays," *Nano letters*, vol. 10, No. 7, (2010); pp. 2310-2317.

Mentzel, Tamar S. et al. "Nanopatterned Electrically Conductive Films of Semiconductor Nanocrystals," *Nano Letters*, vol. 12, No. 8, (Aug. 8, 2012); pp. 4404-4408.

Chen, Peter E. et al. "Tight binding of carboxylate, phosphonate, and carbamate anions to stoichiometric CdSe nanocrystals," *Journal of the American Chemical Society*, vol. 139, No. 8, (2017); pp. 3227-3236.

The extended European Search Report issued on Nov. 9, 2020 for EP Patent Application No. 18788500.9; pp. 1-3.

Yuanyuan Wang et al., "Direct optical lithography of functional inorganic nanomaterials," *Science*, Jul. 28, 2017, vol. 357; pp. 385-388.

The Notice of Reasons for Rejection dated Nov. 13, 2023 (mailed Nov. 21, 2023) issued for Japanese Patent Application No. 2022-172262; pp. 1-5.

David H. Webber et al., "Nanocrystal ligand exchange with 1,2,3,4-thiatriazole-5-thiolate and its facile in situ conversion to thiocyanate," Dalton Trans., 2012, vol. 41, No. 26, pp. 7835-7838. www.rsc.org/dalton.

Non-Final Office Action issued for U.S. Appl. No. 16/604,045 on Nov. 29, 2022; pp. 1-16.

Prem Prabhakaran et al., "Quantum dots (QDs) for photonic applications," *Optical Materials Express* May 1, 2012, vol. 2, No. 5; pp. 578-593.

Shobha Shukla et al., "Two-Photon Lithography of Sub-Wavelength Metallic Structures in a Polymer Matrix," *Adv. Mater.* 2010, 22; pp. 3695-3699.

Taiwan Examination Report and Search Report issue on Aug. 16, 2023 for Taiwan Patent Application No. 108137241; pp. 1-7.

Japanese Office Action issued for JP Patent Application No. 2021-521027 dated Oct. 17, 023; pp. 1-2.

* cited by examiner

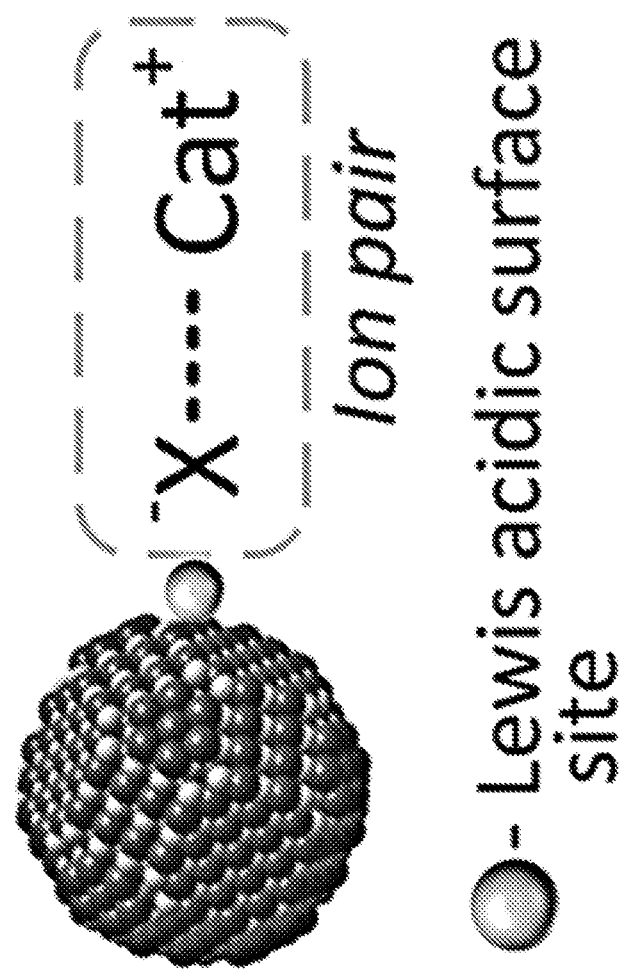

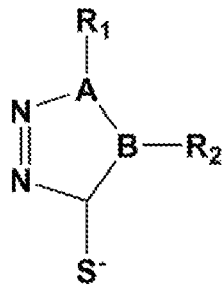

A: N or S or C
B: N or S or C
$R_1$: H or S or Alkyl-
$R_2$: H or S or Alkyl-

Examples: MTT, TTT

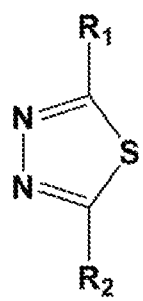

$R_1$: H or S or N or Alkyl-
$R_2$: H or S or N or Alkyl-

Examples: TDD, 5-Methyl-1,3,4 thiadiazole-2-thiol, 2,5-diamino-1,3,4-thiadiazole, 5-Amino-1,3,4 thiadiazole-2-thiol

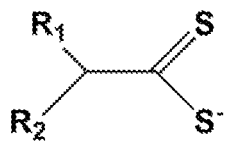

$R_1$: H or S or Alkyl-
$R_2$: H or S or Alkyl-

Examples: Dithiocarboxylates (not test yet)

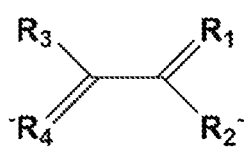

$R_1$: O or S
$R_2$: O or S
$R_3$: O or S
$R_4$: O or S

Examples: DTO

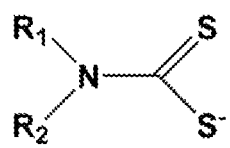

$R_1$: H
$R_2$: H or Alkyl-

Examples: ADC, DTC, HCD

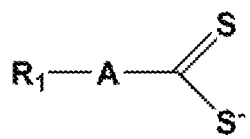

A: C or N or O or S
$R_1$: H or Alkyl-

Examples: PEX

FIG. 1C

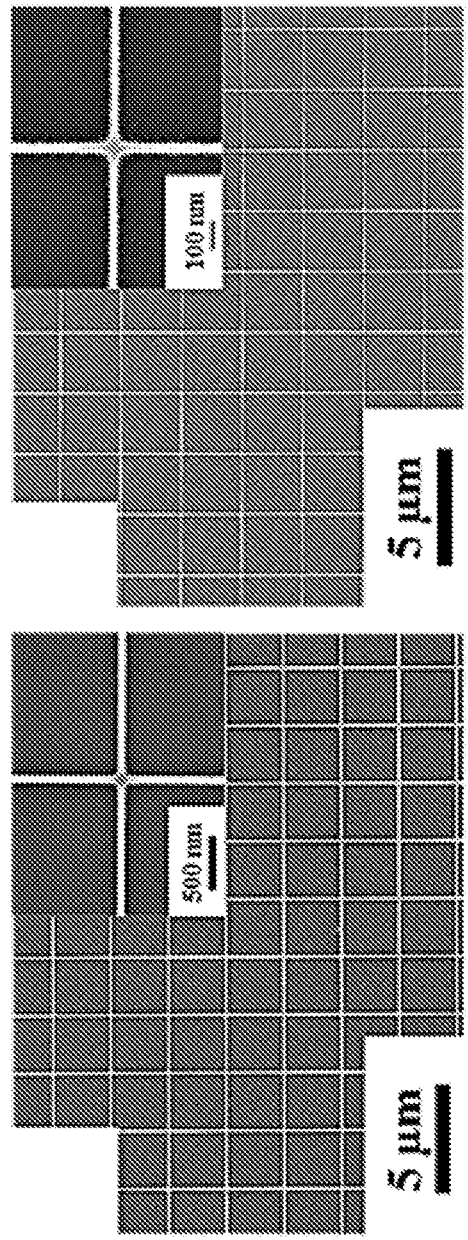
FIG. 8A
FIG. 8B
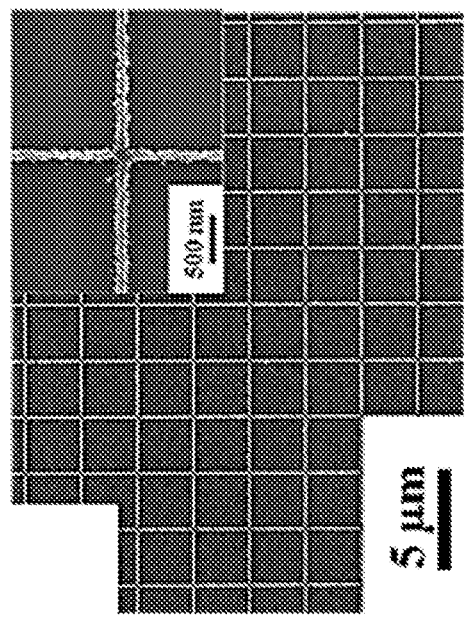
FIG. 8C
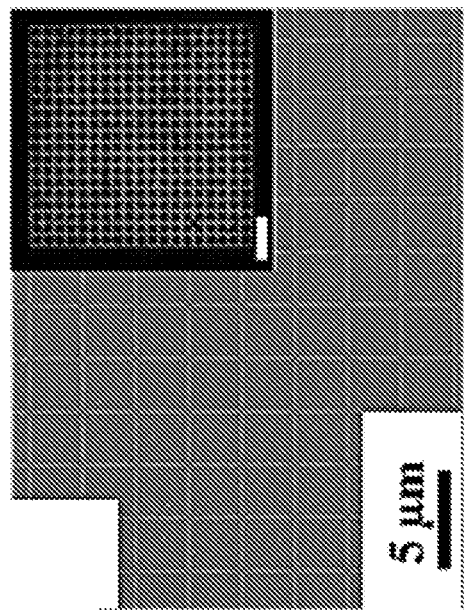
FIG. 8D

PHOTOSENSITIVE, INORGANIC LIGAND-CAPPED INORGANIC NANOCRYSTALS

CROSS-REFERENCE TO RELATED APPLICATIONS

This application is a National Stage of International Application No. PCT/US19/55784, filed Oct. 11, 2019, which claims the priority benefit to U.S. provisional patent application No. 62/746,710 that was filed Oct. 17, 2018, U.S. provisional patent application No. 62/853,448 that was filed May 28, 2019, and U.S. provisional patent application No. 62/897,748 that was filed Sep. 9, 2019, the entire contents of which are incorporated herein by reference.

REFERENCE TO GOVERNMENT RIGHTS

This invention was made with government support under FA9550-15-1-0099 awarded by the Department of Defense, and CHE-1611331 awarded by the National Science Foundation. The government has certain rights in the invention.

BACKGROUND

Solution-processed colloidal nanocrystals (NCs) and quantum dots (QDs) provide a versatile platform for building electronic and optoelectronic devices. These materials enable non-epitaxial deposition and low-temperature processing of light-emitting diodes (LEDs), field effect transistors (FETs), near- and mid-infrared photodetectors, solar cells, etc. The transition from individual devices to the level of electronic circuits, sensor arrays, and high-definition QD LED displays requires the development of material-adapted patterning methods. Depending on the resolution, throughput, and defect tolerance, various patterning and deposition techniques can be considered, including photo- and imprint lithography, microcontact and inkjet printing, and laser or electron beam (e-beam) writing. Among these, photolithography evolved as a method of choice for the electronics industry due to the combination of high-resolution and very low cost per patterned element. The latter comes from the parallel nature of the lithographic process—billions of circuit elements can be defined simultaneously, in contrast to serial techniques like inkjet printing and e-beam writing.

BRIEF DESCRIPTION OF THE DRAWINGS

Illustrative embodiments of the invention will hereafter be described with reference to the accompanying drawings, wherein like numerals denote like elements.

FIGS. 1A-1C show optical patterning of nanoparticles with photosensitive ligands. FIG. 1A is a schematic representation of a nanocrystal with ion pair surface ligands. FIG. 1B shows two complementary approaches to the design of photosensitive ligands: either cation (PAG$^+$) or anion (TTT$^-$) of the ion-pair ligand can react under exposure to ultraviolet (UV) light. FIG. 1C shows the general structures of various classes of bifunctional ligands.

(FIG. 4A) ADC and butyldithiocarbamate (DTC). (FIG. 4B) MTT and TDD. (FIG. 4C) PEX and ammonium 1,1-dithiooxalate (DTO). (FIG. 4D) N-hydroxynaphthalimide triflate (HNT) and 1,2-naphthoquinonediazide-4-sulfonyl chloride (DNQ).

FIG. 5C, PEX; FIG. 5E, DTO) Scanning electron microscopy (SEM) image of patterned USAF resolution test grids with CdSe-MTT NCs (FIG. 5B), CdSe-PEX NCs (FIG. 5D), CdSe-DTO NCs (FIG. 5E). (FIG. 5G) SEM image of patterned USAF resolution test grids with CeO$_2$ NCs Direct Optical Lithography of Functional Inorganic Nanomaterials (DOLFIN) inks. (FIG. 5H) Optical microscopy images of two sequentially patterned CeO$_2$ NCs layers with 5-µm-wide stripes. NCs before and after capping with photosensitive anions in DMF (FIG. 5I, DTC). SEM image of patterned USAF resolution test grids with CdSe-DTC NCs (FIG. 5J).

(FIG. 6A) Absorption spectra of NCs with the bound photosensitive anion ammonium hydrazinecarbodithioate (HCD) in MeOH and Wz-CdSe NCs capped with HCD in DMF. Optical microscopy images of various patterned NC films by 365 nm UV light: (FIG. 6B) CdSe/ZnS—HCD NCs, (FIG. 6C) InP—ZnS—HCD NCs, (FIG. 6D) CeO$_2$-DTO NCs, and (FIG. 6E) ZrO$_2$ NCs with HNT.

FIGS. 8A-8D. Direct patterning of nanomaterials with electron beam. SEM image of e-beam lithography (EBL) patterned "bare" CeO$_2$ with the line width of (FIG. 8A) 50 nm, (FIG. 8B) 30 nm. (FIG. 8C) CdSe—Sn$_2$S$_6$ NCs patterned with the line width of 100 nm and (FIG. 8D) CdSe/ZnS—Sn$_2$S$_6$-PAG with the line width of 100 nm. The inset shows photoluminescence from 100 nm wide stripes of CdSe/ZnS NCs, patterned with e-beam, scale bar: 10 µm.

FIG. 12A. Rhodamin B base (RB) combines with a proton to form its acidic form. UV-Vis absorption spectra of.

DESCRIPTION

Ligand-capped inorganic particles, films composed of the ligand-capped inorganic particles, and methods of patterning the films are provided. Also provided are electronic, photonic, and optoelectronic devices that incorporate the films.

Figure 1B:
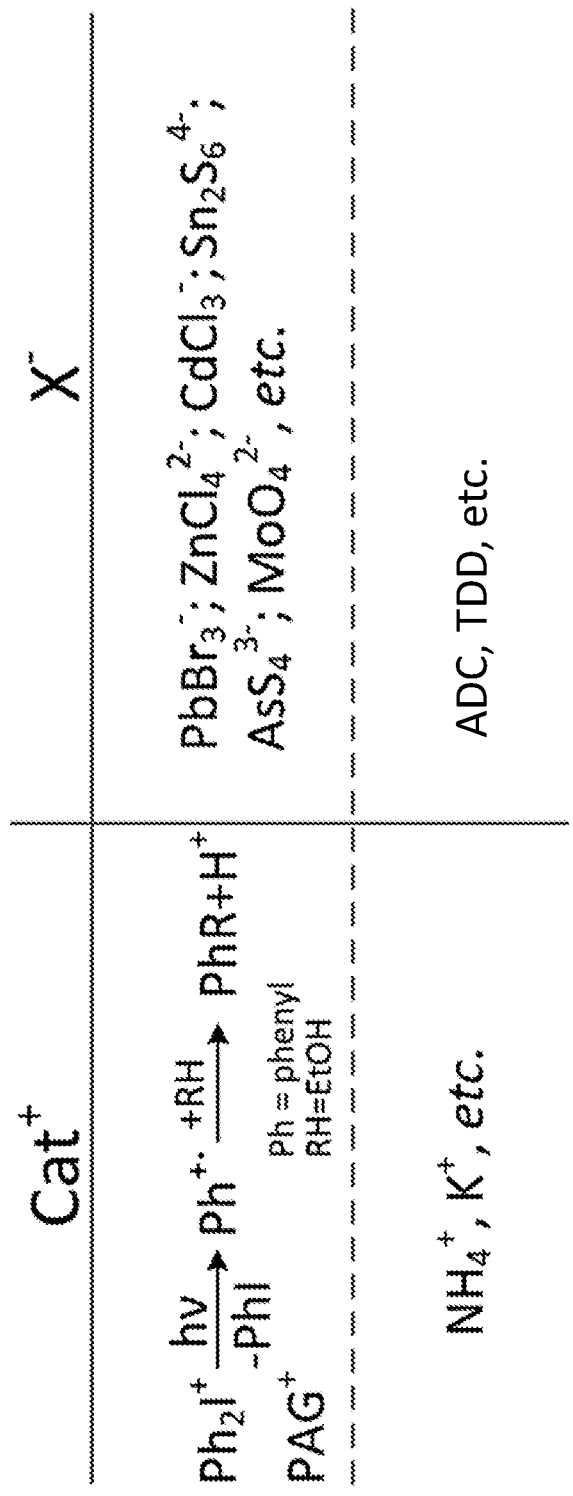

The ligands can be categorized into two classes: bifunctional ligands (FIG. 1B, lower panels) and two-component ligand systems than include a surface binding inorganic anion (the ligand) and a photosensitive cation or photosensitive non-ionic molecule (FIG. 1B, upper panels). The bifunctional ligands are small molecule, anionic particle-surface binding ligands that include a photosensitive group. The small molecules serve the dual functions of providing the inorganic particles to which they are bound with colloidal stability and undergoing a chemical transformation upon optical excitation. The anionic bifunctional ligands are associated with cationic counter ions that form a diffuse cloud around the inorganic particles in solution. For the two-component ligand systems, it is the cation or non-ionic molecule that undergoes a chemical transformation upon optical excitation. For the purposes of this disclosure, ions that are associated with a particle as a diffuse cloud are still considered to be "capping" the particle.

The anionic bifunctional ligands with their associated counter ions and the two-components ligand system that include a surface-binding anion and photosensitive cation are constructed as ion pairs, $Cat^+X^-$, where $X^-$ is an electron-rich nucleophilic group that binds to electron-deficient (e.g., Lewis acidic) surface sites, such as metal sites, on the inorganic particle surface. In both embodiments, the negative charge on the $X^-$ anion is balanced by the positive charge on the cation, $Cat^+$, as shown in FIG. 1A. In polar solvents, the cations may dissociate from the particle surface and form an ionic cloud responsible for colloidal stabilization, while in nonpolar environments or in films the ion pairs stay tightly bound. In films cast from solutions of the ligand-capped inorganic particles, the diffuse cations are re-associated with their anions in order to preserve charge neutrality.

For the purposes of this disclosure, a chemical group, ion, or molecule is photosensitive if irradiating the group, ion, or molecule with light of an appropriate wavelength induces a chemical transformation in the group, ion, or molecule. For both classes of ligands, the chemical transformations that take place upon optical excitation result in a change in the solubility of their associated inorganic particles in solution. This solubility change enables dispersions of the ligand-capped particles to act as photoresists for the lithographic patterning of films formed from the dispersions.

Inorganic Particles

The particles to which the ligands can be bound include nanocrystals, where a nanocrystal is a crystalline particle having at least one nanoscale dimension—typically no greater than 1000 nm, for example, or no greater than 500 nm. Some nanocrystals have no dimension that is greater than 1000 nm. However, larger particles can also be used. The nanocrystals can have a variety of regular and irregular shapes and include substantially round nanocrystals and elongated nanocrystals, such as nanorods or nanowires. The particles, including the nanocrystals, can be composed of electrically conductive materials, semiconducting materials, dielectric materials, magnetic materials, catalytic materials, and/or light up-converting materials. Suitable particles include metal particles, metal alloy particles, metal chalcogenide particles, metalloid particles, Group IV semiconductor particles, Group II-VI semiconductor particles, Group III-V semiconductor particles, metal oxide particles, and metalloid oxide particles. Suitable nanocrystals include core-shell nanocrystals having an inner core material surrounded by an outer shell material. The inorganic nanocrystals can be made, for example, using colloidal synthesis, gas phase synthesis, or ball-milling.

Examples of Group II-VI nanocrystals to which the photosensitive ligands can be bound include CdSe nanocrystals, CdTe nanocrystals, ZnS nanocrystals, ZnSe nanocrystals, HgSe nanocrystals, HgTe nanocrystals, HgS nanocrystals, $Hg_xCd_{1-x}Te$ nanocrystals, $Hg_xCd_{1-x}S$ nanocrystals, $Hg_xCd_{1-x}Se$ nanocrystals, $Cd_xZn_{1-x}Te$ nanocrystals, $Cd_xZn_{1-x}Se$ nanocrystals, $Cd_xZn_{1-x}S$ nanocrystals, CdS nanocrystals, and ZnTe nanocrystals, where $0<x<1$. Larger particles of these materials can also be used.

Examples of Group III-V nanocrystals to which the photosensitive ligands can be bound include InP nanocrystals, InAs nanocrystals, InSb nanocrystals, GaAs nanocrystals, GaP nanocrystals, GaN nanocrystals, GaSb nanocrystals, InN nanocrystals, InSb nanocrystals, AlP nanocrystals, AlN nanocrystals, and AlAs nanocrystals. Larger particles of these materials can also be used.

Examples of Group IV nanocrystals to which the photosensitive ligands can be bound include Si nanocrystals, Ge nanocrystals, SiGe nanocrystals, and SiC nanocrystals. Larger particles of these materials can also be used.

Examples of metal oxide nanocrystals to which the photosensitive ligands can be bound include $Fe_2O_3$ nanocrystals, $Al_2O_3$ nanocrystals, $ZrO_2$ nanocrystals, $CeO_2$ nanocrystals, ZnO nanocrystals, FeO nanocrystals, $Fe_3O_4$ nanocrystals, $HfO_2$ nanocrystals, and indium gallium zinc oxide (IGZO) nanocrystals. Larger particles of these materials can also be used.

Examples of metal nanocrystals, including metal chalcogenide nanocrystals, to which the photosensitive ligands can be bound include Au nanocrystals, Ag nanocrystals, Fe nanocrystals, Pt nanocrystals, FePt nanocrystals, Bi nanocrystals, $Bi_2S_3$ nanocrystals, $Bi_2Se_3$ nanocrystals, $Bi_2Te_3$ nanocrystals, Co nanocrystals, CoPt nanocrystals, $CoPt_3$ nanocrystals, Cu nanocrystals, $Cu_2S$ nanocrystals, $Cu_2Se$ nanocrystals, $CuInSe_2$ nanocrystals, $CuIn_{(1-x)}Ga_x(S,Se)_2$ nanocrystals, where $0<x<1$, $Cu_2ZnSn(S,Se)_4$ nanocrystals, GaSe nanocrystals, Ni nanocrystals, PbS nanocrystals, PbSe nanocrystals, PbTe nanocrystals, Pd nanocrystals, Ru nanocrystals, Rh nanocrystals, and Sn nanocrystals. Larger particles of these materials can also be used.

Examples of core-shell (core/shell) nanocrystals with which the photosensitive ligands can be bound include CdSe/CdS, CdSe/ZnS, CdSe/CdZnS, InP/ZnS, and ZnSe/ZnS.

Bifunctional Ligands

The structures of some embodiments of the anionic bifunctional ligands are shown in FIG. 1C, where the A-, B-, R1, and R2 groups on the depicted structures are independently selected from the listed atoms or alkyl groups, as shown in the figures. The alkyl-groups may be, for example, small alkyl groups containing 1 to 6 carbon atoms, such as (methyl, ethyl, butyl, propyl, and pentyl groups. Specific examples of the bifunctional ligands containing photosensitive groups include hydrazinecarbodithiolate anions and iron oxalates, such as $(Fe(C_2O_4)_3)^{2-}$. When the latter anions are irradiated with radiation of the appropriate wavelengths, the Fe(III) turns to Fe(II), which subsequently changes the binding ability between the anion and inorganic particle surface, and further changes the solubility of the ligand-capped particles in organic solvents.

Other photosensitive anions include dithocarboxylates and dithiocarbamate anions, such as N-alkyl dithiocarbamate anions, and N,N-dialkyl dithiocarbamate anions. Specific examples of dithiocarbamates include N-methyl dithiocarbamate, N,N-dimethyl dithiocarbamate, N-ethyl dithiocarbamate, N N-diethyl dithiocarbamate, DTC, N,N-dibutyl dithiocarbamate, and ADC.

Other photosensitive bifunctional ligand anions include azoles that exhibit photolytic behavior. Azoles are a class of five-membered heterocyclic compounds containing at least one nitrogen atom and other noncarbon atoms (e.g., nitrogen, sulfur, or oxygen). Suitable azoles include triazoles and tetrazoles. Examples of bifunctional ligand azoles include deprotonated MTT, TDD, and 1, 2, 3, 4-thiatriazole-5-thiolate ($S_2CN_3^-$, "TTT"). The azoles exhibit photolytic behavior upon exposure to radiation, including UV light. For example, upon UV exposure, tetrazoles can form products such as nitrilimines, carbodiimides, and cyanamides.

Still other bifunctional ligands include xanthate and thiooxalate ligands, which can bind strongly with transition metal cations to form charge-neutral complexes and are photochemically active upon exposure to UV radiation. DTO is a compact, four-atom photochemically active ion, have a structure that enables either five-membered (side-on) or four-membered (end-on) chelate rings. PEX is an example of a xanthate ligand. In addition, by tailoring the number of sulfur atoms, thiooxalate ligands, including monothio-oxalate, 1,2-dithio-oxalate, trithio-oxalate, and tetrathio-oxalate, could be made for use as bifunctional ligands.

The compositions and solid films described herein can include any one of the bifunctional ligands described herein or any combination of two or more of the bifunctional ligands. However, various embodiments of the compositions and solid films can also selectively exclude any of the bifunctional ligands disclosed herein, while including one or more of the other bifunctional ligands. For example, various embodiments of the compositions and films, the bifunctional ligands are not 1,1-dithiooxalate, ethyl xanthate, mercapto-1-methyltetrazole, or 1, 2, 3, 4-thiatriazole-5-thiolate.

Charge-balancing cations that can be associated with the bifunctional ligands include alkali metal ions, such as $Na^+$ or $K^+$, transition metal cations, ammonium cations ($NH_4^+$), hydrazinium cations ($N_2H_5^+$), diazenium cations ($N_2H_3^+$), and alkyl ammonium cations, including quaternary ammonium cations, which can be represented by the formula $NR_4^+$, where R represents a hydrogen atom, an alkyl group, an aryl group, or a combination thereof.

Two-Component Ligand Systems

The use of two-component ligand systems can be advantageous because it enables various outcomes that are not easily obtained in a bifunctional ligand. For example, the two-component ligand systems allow inorganic particles capped with non-photosensitive, surface-binding inorganic anionic ligand to be patterned with 365 or 405 nm light.

Surface-Binding Inorganic Anions ("Stabilizing Ligands")

The surface-binding anion ligands that provide colloidal stability include conventional organic (e.g., fatty carboxylic acids and alkylamines) or inorganic ($S^{2-}$, $CdCl_3^-$, $Sn_2S_6^{4-}$, etc.) ligands, which provide colloidal stability to the inorganic particles and are not photosensitive to the light used to pattern films. Generally, these stabilizing ligands can be classified as two types: tight-binding ligands which bind strongly to the surface of the particle, while their corresponding photosensitive cations or molecules form a diffuse cloud around the particle, yielding a zero zeta potential; and weak-binding ligands that are weakly electrostatically coordinated with the a positively charged particle surface in polar media. The tight-binding anions are typically metal-containing anions, while the weak binding anions are more generally metal-free anions.

The weak-binding anions can create a positively-charged particle surface by acting as stripping agents to remove native organic ligands that are initially bound to the surface of the particle. This stripping can be carried out using a solution of a stripping agent that includes a salt of the weak-binding anion at a temperature that facilitates the exchange of the organic ligands with the anions. The organic ligands initially bound to the surface of the particles may be native ligands that are present by virtue of the particle synthesis. Such ligands include, but are not limited to, lipophilic ligands, such as oleate and oleylamine (OAm) ligands. Examples of such salts include tetrafluoroborate salts (e.g. $NOBF_4$, $Et_3OBF_4$), metal triflate salts (e.g. $Zn(OTf)_2$, $Cd(OTf)_2$), metal nitrate salts (e.g. $Zn(NO_3)_2$, $In(NO_3)_2$), sulfate salts, and phosphate salts.

Metal-containing anions include metal anions, metal halide anions, metal chalcogenide anions, and/or metal oxide anions. For example, various embodiments of the anions have the following formulas: $MX_n^{m-}$, where M represents a metal atom, X represents a halogen atom, n represents the stoichiometry of the halogen atom (e.g., n=3 or n=4), and m represents the degree of anionic charge (e.g., m=1 or m=2) (examples include $CdCl_3^-$, $CdCl_4^{2-}$, $PbBr_3^-$, $InCl_4$, and $ZnCl_4^{2-}$); $MCh_n^{m-}$, where M represents a metal atom, Ch represents a chalcogen atom, n represents the stoichiometry of the chalcogen atom (e.g., n=2, 3, 4, 5, or 6), and m represents the degree of anionic charge (e.g., m=2, 3, or 4) (examples include $CdTe_2^{2-}$, $Sn_2S_6^{4-}$, $AsS_4^{3-}$, and $SnS_4^{4-}$); and $MO_z^{y-}$, where M represents a metal atom, z represents the stoichiometry of the oxygen atom (e.g., z=4), and y represents the degree of anionic charge (e.g., y=2) (examples include $MoO_4^{2-}$). Other examples include metal phosphorus oxides (e.g., $P_2W_{18}O_{62}^{6-}$ and $PMo_{12}O_{40}^{3-}$).

Metal-free anions include chalcogenide anions, halide anions, oxygen anions ($O^{2-}$), sulfide anions ($S^{2-}$), and azide anions ($N_3^-$). Metal-free anions also include oxides of the non-metals sulfur, phosphorus, nitrogen and carbon, including sulfide anions ($SO_3^{2-}$), sulfate ions ($SO_4^{2-}$), phosphate anions ($PO_4^{3-}$), nitrate anions ($NO_3^-$), tetrafluoroborate anions ($BF_4^-$), triflate (OTf-), and cyanate ($OCN^-$) anions. For example, various embodiments of the halide anions have the formula $X_n^{m-}$, where X represents a halogen atom, n represents the number of the halogen atoms (e.g., n=1), and m represents the degree of anionic charge (e.g., m=1) (examples include $Cl^-$). Other metal-free anions include carbamate salts (e.g., $RHNCOO^-$, where R is H or an alkyl group), such as ammonium carbamate salts. Such salts can be formed by converting primary amines into their corresponding carbamate salts in the presence of carbon dioxide, using the general reaction:

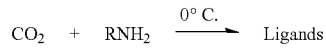

where R is an alkyl group, such as a propyl, butyl, pentyl, hexyl, or octyl group, in order to yield propyl carbamate, pentyl carbamate, hexyl carbamate, or octyl carbamate, respectively.

Photochemically Active Cations and Molecules

The photochemically active component of the two-component ligand systems are designed to have minimal interactions with the particle surface when initially added to a solution. Without intending to be bound to any particular theory of the invention, the inventors propose that these components can alter the solubility of particles in two ways. First, the photosensitive component may serve as a physical spacer between the particles in films formed from the particles. If the molecular size of the component is large enough, this prevents the particles from getting too close to each other and falling into an irreversible van der Waals potential well. Second, the photosensitive components can decompose upon irradiation, altering the local environment around the particle, such as local pH and/or ionic strength. These changes can impact the particle dissolution rate, making it possible to form patterns in the film.

The photochemically active cations and molecules of the two-component ligand systems include the cations of PAG salt and non-ionic PAGs. PAGs are photoinitiators that break down when they are irradiated with light of an appropriate wavelength to release an acid proton. Suitable PAG cations include sulfonium-based cations and iodonium-based cations, such as aryl sulfonium cations and aryl iodonium cations. Advantages of these compounds are their good thermal stability and high solubility in polar solvents, which allow for high loadings of the PAG in the inorganic particle films. Various embodiments of these cations include, for example, a diaryliodonium group, a triarylsulfonium group, or a diarylalkylsulfonium group. Imide-based PAGs can also be used. Examples of PAG cations include those having a diphenylsulfonium group, a diphenyl iodonium group, a methyl phenyl sulfonium group, or a triphenysulfonium group. Specific examples of PAG cations include bis(4-tert-butylphenyl)iodonium, boc-methoxyphenyldiphenylsulfonium, (tert-butoxycarbonylmethoxynaphthyl)-diphenylsulfonium, (4-tert-butylphenyl)diphenylsulfonium, diphenyliodonium, (4-fluorophenyl)diphenylsulfonium, (4-iodophenyl)diphenylsulfonium, (4-methoxyphenyl)diphenylsulfonium, (4-methylphenyl) diphenylsulfonium, (4-methylthiophenyl)methyl phenyl sulfonium, (4-phenoxyphenyl)diphenylsulfonium, (4-phenylthiophenyl)diphenylsulfonium, triphenylsulfonium, and tris(4-tert-butylphenyl)sulfonium. PAG salts incorporating photochemically active cations include aryl sulfonium triflate (AST) and aryl iodonium triflate (AIT) ionic salts, which release triflic acid upon deep ultraviolet (DUV) irradiation. DNQ, which has a broad absorption band spanning 340-450 nm, is another example of an ionic PAG. By adjusting the conjugated π-system of the cations of the PAG salts, the absorption band for this class of photoactive cations can be extended to about 360 nm.

In some embodiments of the two-component ligand systems, the ligand is an anion having the structure $MX_4$, where M represents a metal atom, such as a metal atom from group 12 or group 13 of the periodic table of the elements, X represents a halogen atom, and the photosensitive component is a cation having the formula $A_2$ where A represents a PAG cation. In the ligand, $MX_4$ can be, for example, $CdCl_4$, $ZnCl_4$, or $InCl_4$. Such ligands may be used as sintering promoters upon annealing.

For embodiments of the two-component ligand systems that use non-ionic PAGs as the photosensitive component, the non-ionic PAGs are not bound to the nanoparticle surface as part of an ion pair. Instead, the non-ionic PAGs are included in a solution comprising the nanoparticles. The non-ionic PAGs are neutral organic molecules containing functional groups such as carbonic esters, chloromethyl triazines, imino sulfonates, N-hydroxyimide sulfonates, and the like. The diversity in chemical structure of available non-ionic PAGs allows the photosensitivity achievable by the present methods to be tuned across a wide range of wavelengths. Without intending to be bound to any particular theory of the invention, the inventors proposed that the patterning mechanism for ligand systems comprising non-ionic PAGs can be attributed to changes in local ionic concentration, which compresses the electrostatic double layer around the particles, reducing repulsion between particles and resulting in a slower dissolution rate. Notably, non-ionic PAG ligands are able to stabilize larger particles (e.g., particles having a size of 1 μm or greater) in polar organic solvents.

Examples of non-ionic PAGs that can be used in the two-component ligand systems include, N-hydroxy-5-norbornene-2,3-dicarboximide perfluoro-1-butanesulfonate, HNT, 2-(4-methoxystyryl)-4,6-bis(trichloromethyl)-1,3,5-triazine, 4-N,N-dimethylaminophenyl p-toluenesulfonate, methyl trifluoromethane sulfonate, phenyl trifluoromethanesulfonate, 2-naphthyl trifluoromethanesulfonate, 4-nitrophenyl trifluoromethanesulfonate, and 3-diazo-3,4-dihydro-4-oxonaphthalene-1-sulfonyl chloride. In some embodiments, non-ionic PAGs other than N-hydroxynaphthalimide triflate are used. The particles in these embodiments may be the same types of metal particles, metal alloy particles, metal chalcogenide particles, metalloid particles, Group IV semiconductor particles, Group II-VI semiconductor particles, Group III-V semiconductor particles, metal oxide particles, and metalloid oxide particles, including core-shell nanoparticles, that are described above with regard to the anionic ligand-capped nanoparticle embodiment.

The photosensitive component of the two-component ligand systems can also be a photobase generator (PBG). The working mechanism of PBGs in the ligand-capped particles is like that of PAGs, except that a base, instead of an acid, is released from PBG molecules upon irradiation. Such a base will cause the chemical modification of ligand-capped particles. By way of illustration, a composition comprising CdSe particles having surface-bound, PBG-containing ligands can be prepared by mixing a ligand comprising a PBG cation and a surface-binding anion of the type described herein (e.g., metal halides, metal chalcogenides, metal oxides, chalcogenides, halides, or $O^{2-}$, or a combination of two or more thereof), with organic ligand-capped CdSe particles, wherein the organic ligands are exchanged with the PBG-containing ligands. PBG cations include, for example, the cations of Co(III)-amine and alkyl amine salts, O-acyloximes, benzyloxycarbonyl derivatives, and/or formamides. Upon irradiation, the amines released from the PBGs change the particles' surfaces from hydrophilic to hydrophobic.

Photopatterned Films

Photopatternable films containing ligand-capped inorganic particles can be formed by coating a substrate with a dispersion of the ligand-capped inorganic particles and allowing the coating to dry. The resulting films can be patterned to provide patterned inorganic films for use in a wide range of devices. The coatings can be formed using, for example, casting, spinning, spraying, printing, and/or slot-die coating techniques. In the methods, a first portion of a film comprising inorganic particles is irradiated with radiation that includes wavelengths that induce a chemical change in the photosensitive anions or cations of the ion pairs or the photosensitive non-ionic PAG, while a second portion of the film is protected from the radiation. As a result, the exposed portion of the film undergoes a chemical modification. Then, either the first portion of the film or the second portion of the film is selectively removed. Patterns with high resolutions, including resolutions of 1 μm or better and further including resolutions of 20 nm or better, can be formed in thin films, including films with thicknesses in the range from 5 nm to 200 nm. The incident radiation wavelengths will depend on the particular bifunctional ligand, photosensitive cation, or photosensitive non-ionic molecule being used. In various embodiments of the methods, radiation having wavelengths in the UV, including the DUV and extreme ultraviolet (EUV), the visible, and/or the infrared (IR) regions of the electromagnetic spectrum may be used. For example, UV light with a wavelength of 365 nm and/or a wavelength of 254 nm can be used; and visible light with a wavelength of 405 nm can be used. The incident radiation may also be an e-beam. After patterning, the solvents and/or removed particles can be recycled.

In some embodiments of the methods, the irradiated portion of the film is rendered insoluble in an organic solvent, or at least less soluble in an organic solvent than the protected portion of the film. In other embodiments, the irradiated portion of the film is rendered soluble in an organic solvent, or at least more soluble in an organic solvent than the protected portion of the film. In these embodiments, the more soluble portion of the film can be selectively removed by contacting the film with an organic solvent that dissolves the more soluble portion of the film, but not the other portion. In some embodiments, the solvent is a polar organic solvent, such as DMF, N-methylformamide (NMF), or dimethyl sulfoxide (DMSO).

If the films include a PAG as a photosensitive component within the film, the radiation is selected such that it is absorbed by and breaks down the PAG to produce an acid. That acid, in turn, reacts with the film to render the irradiated portion of the film insoluble in an organic solvent, while any unexposed portion of the film remains soluble in that solvent. The soluble portion of the film can then be selectively removed by contacting it with the solvent. Alternatively, the radiation can convert a photosensitive anion, cation, or molecule that is soluble in an organic solvent into an anion, cation, or molecule that is insoluble in the organic solvent. For example, $S_2CN_3$ anions are soluble in certain polar organic solvents but are converted into SCN anions, which are insoluble in those polar organic solvents upon exposure to UV radiation.

Another method of patterning a film composed of ligand-capped particles, such as ligand-capped nanocrystals, starts with a film comprising inorganic particles capped with lipophilic organic ligands, such as oleate ligands or oleylamine ligands. The film is exposed to a solution that includes PAG cations and anions. A portion of the film is then irradiated, whereby photogenerated protons generated from the PAGs attack the lipophilic ligands, which are replaced by the anions from the solution. However, the anions form only a weak bond with the particle surface and, as a result, the irradiated portion of the film can be selectively washed away with an organic solvent.

Another method of patterning a film composed of inorganic particles in a sol-gel starts with a film comprising inorganic molecular precursors. As used here, an inorganic molecular precursor refers to a molecule of compound that reacts to form an inorganic particle. The film is exposed to a solution that includes PAG cations and anions. A portion of the film is irradiated, whereby photogenerated protons generated from the PAG accelerate the hydrolysis process and cause polymerization of precursor molecules. However, the inorganic molecular precursors keep their original state in the unirradiated portion and, as a result, can be selectively washed away with an organic solvent, as described herein. The inorganic particles can be, for example, metal oxide nanocrystals such as $Al_2O_3$, $ZrO_2$, ZnO, NbO, $SiO_2$, and/or InGaZnO nanocrystals; and the molecular precursors for each of these can be, for example, aluminum-tri-sec-butoxide ($Al(OC_4H_9)_3$); zirconium acetylacetonate ($Zr(acac)_2$); zinc acetate ($Zn(OAc)_2$); tetraethoxysilane (TOES); or a mixture of indium nitrate ($In(NO_3)_3$), gallium nitrate ($Ga(NO_3)_3$), and zinc acetate ($Zn(OAc)_2$), respectively.

The particles in the patterned films retain their optical and electronic properties and can be used to in a variety of electronic and optical components, including diffraction grating and electrical circuits. The patterned films can be incorporated as electrically conducting materials, semiconducting materials, magnetic materials, dielectric materials, catalytic materials, and/or light up-converting materials in a variety of devices, including transistors, light-emitting diodes, photovoltaic cells, thermoelectric devices, capacitors, and photodetectors. These devices will generally include the additional components common to such devices, including, for example, an anode and a cathode in electrical communication with the films.

Figure 2:
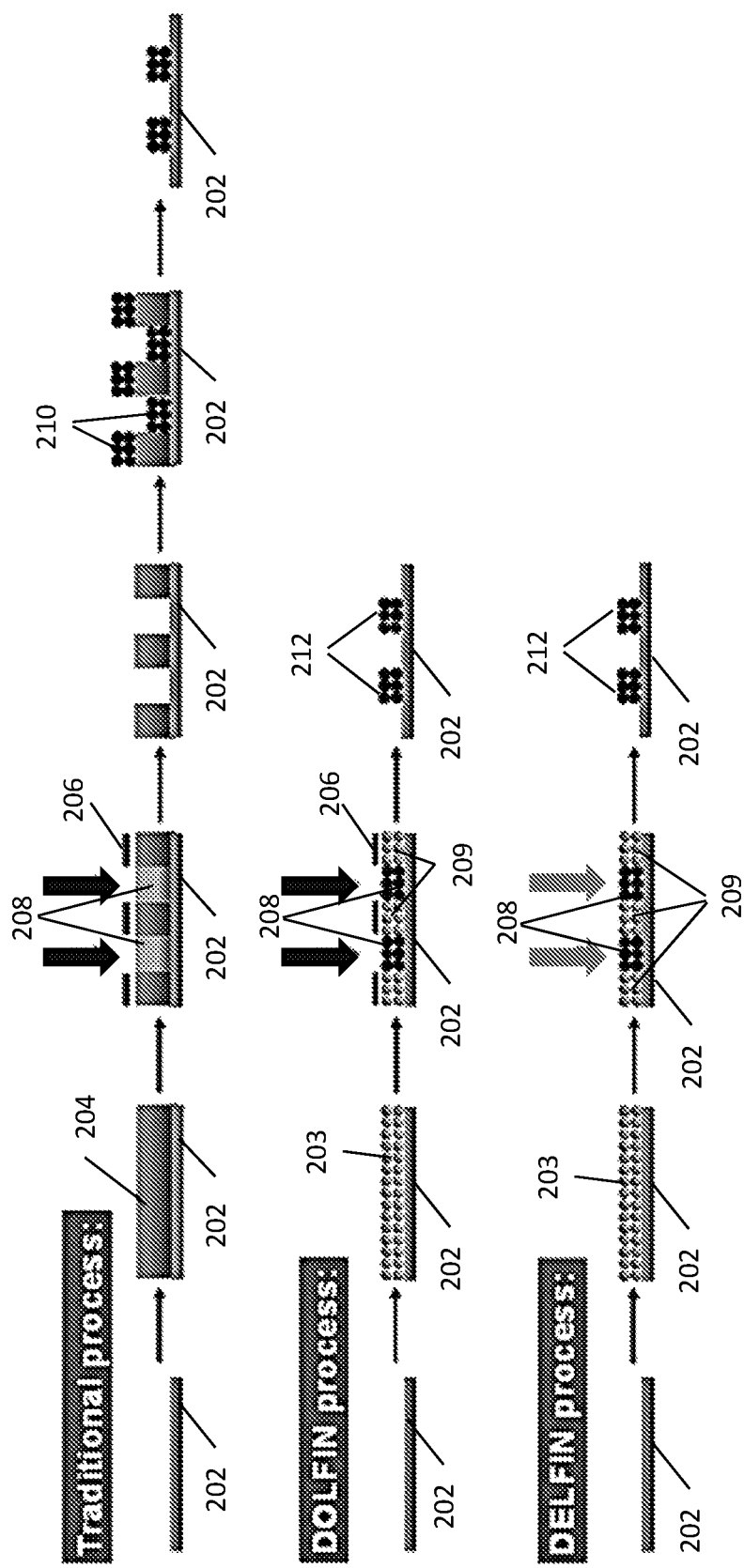
FIG. 2 shows a schematic comparison of traditional lithography, DOLFIN, and DELFIN

Direct optical patterning in accordance with the present methods is referred to here in as Direct Optical Lithography of Functional Inorganic Nanomaterials (DOLFIN), while direct e-beam patterning in accordance with the present methods is referred to herein as Direct Electron-Beam Lithography of Functional Inorganic Nanomaterials (DELFIN). A schematic comparison of traditional lithography, DOLFIN, and DELFIN is shown in FIG. 2. In the traditional process, a photoresist 204 is coated onto a substrate 202 and exposed to radiation (arrows) through a mask 206. The exposed portion 208 is then removed, leaving a pattern in the photoresist. A film of nanocrystals 210 is then deposited over the patterned photoresist, followed by the selective removal of the remaining photoresist. In DOLFIN, a nanocrystal film 203 is deposited directly on substrate 202 and exposed to radiation (arrows) through a mask 206, thereby rendering the exposed portion 208 of the nanocrystal film insoluble in an organic solvent. The unexposed portion 209 of nanocrystal film 203 is then selectively removed by washing in the organic solvent, leaving a patterned nanocrystal film 212 on substrate 202. In DELFIN, a nanocrystal 203 is deposited directly on substrate 202 and exposed to an electron beam (arrows), thereby rendering the portion of the film that was exposed to the beam 208 insoluble in an organic solvent. The unexposed portion 209 of nanocrystal film 203 is then selectively removed by washing in the organic solvent, leaving a patterned nanocrystal film 212 on substrate 202.

EXAMPLES

Example 1

This example demonstrates that by chemical design of the surface ligands, NCs inks can be tuned to fulfill various requirements. This example further illustrates new ligand systems optimized for accessibility, stability, and compatibility with various solvents and optical wavelengths, demonstrating that direct optical lithography of functional inorganic nanomaterials (DOLFIN) and direct electron beam lithography of functional inorganic nanomaterials (DELFIN) are versatile technological platforms for real-world additive manufacturing.

Figure 3A:
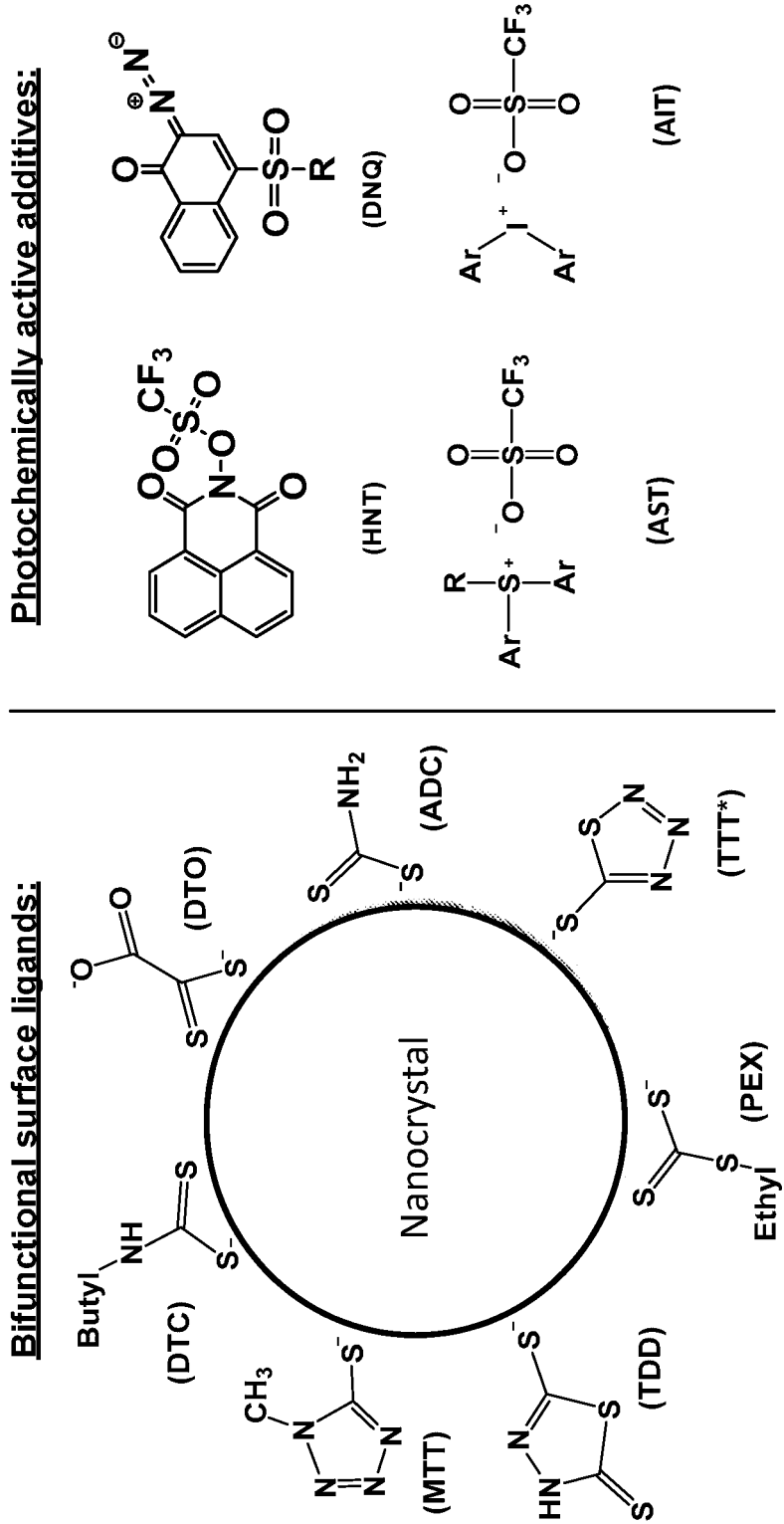
FIGS. 3A and 3B show the chemical structures (FIG. 3A) and light-induced chemical transformations (FIG. 3B) of certain inorganic capping ligands used in Example 1.
Figure 3B:
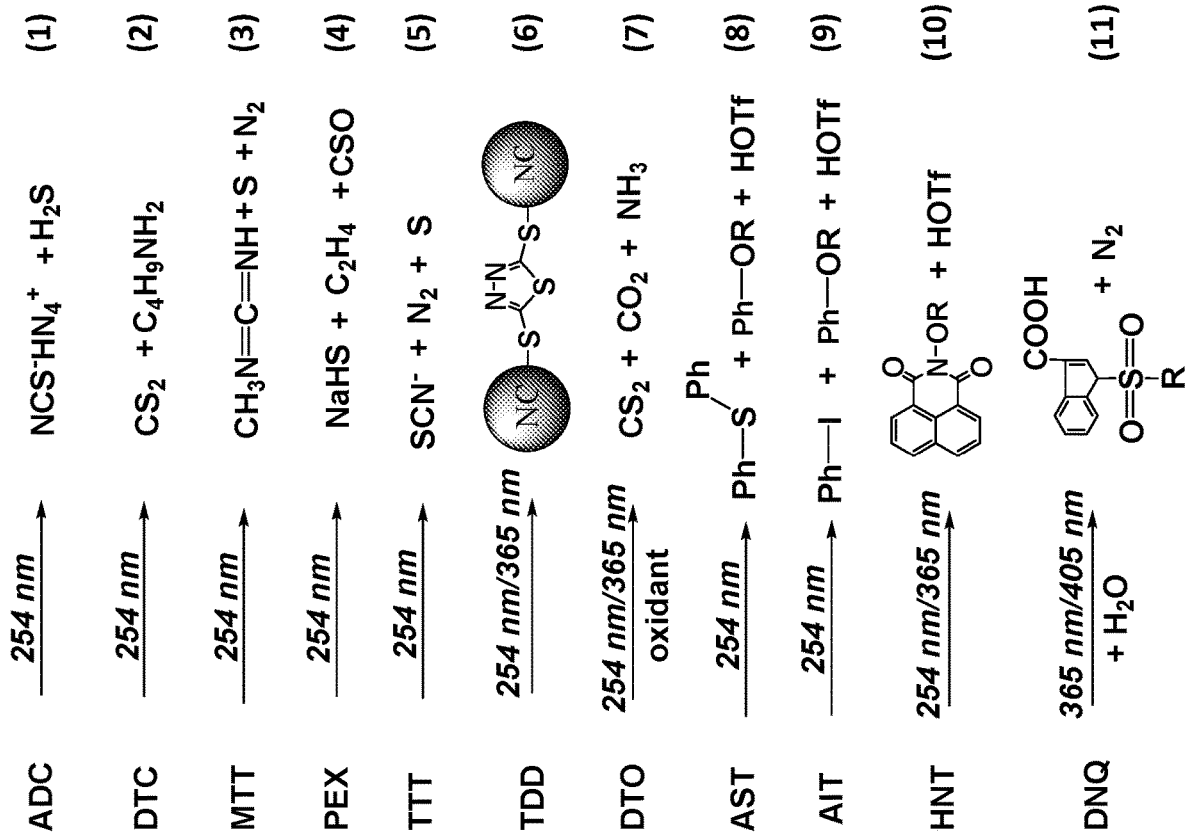
Figure 3C:
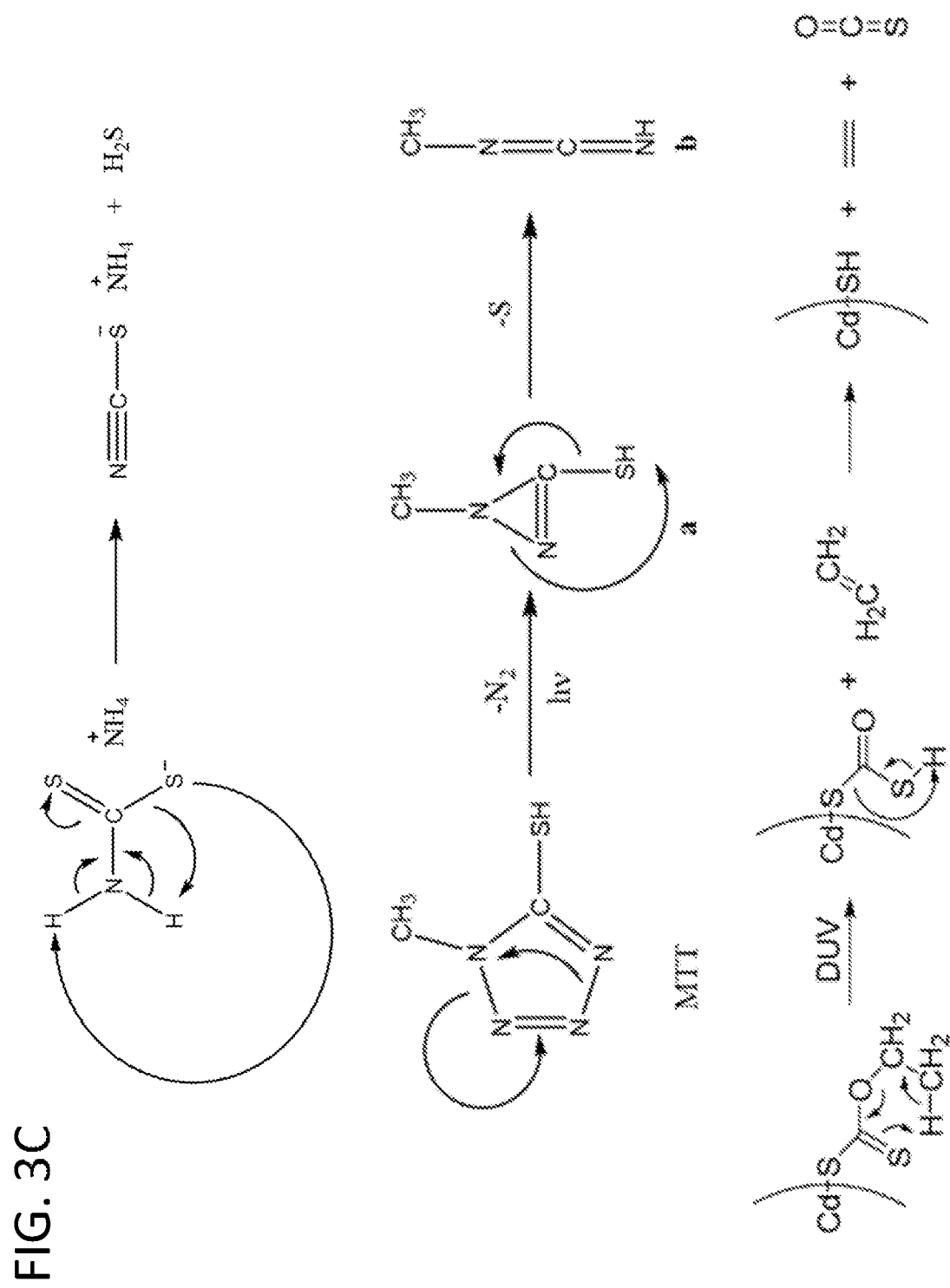
FIG. 3C shows proposed decomposition pathways for ammonium dithiocarbamate (ADC), 5-Mercapto-1-methyltetrazole (MTT), and potassium ethyl xanthate (PEX).
Figure 3D:
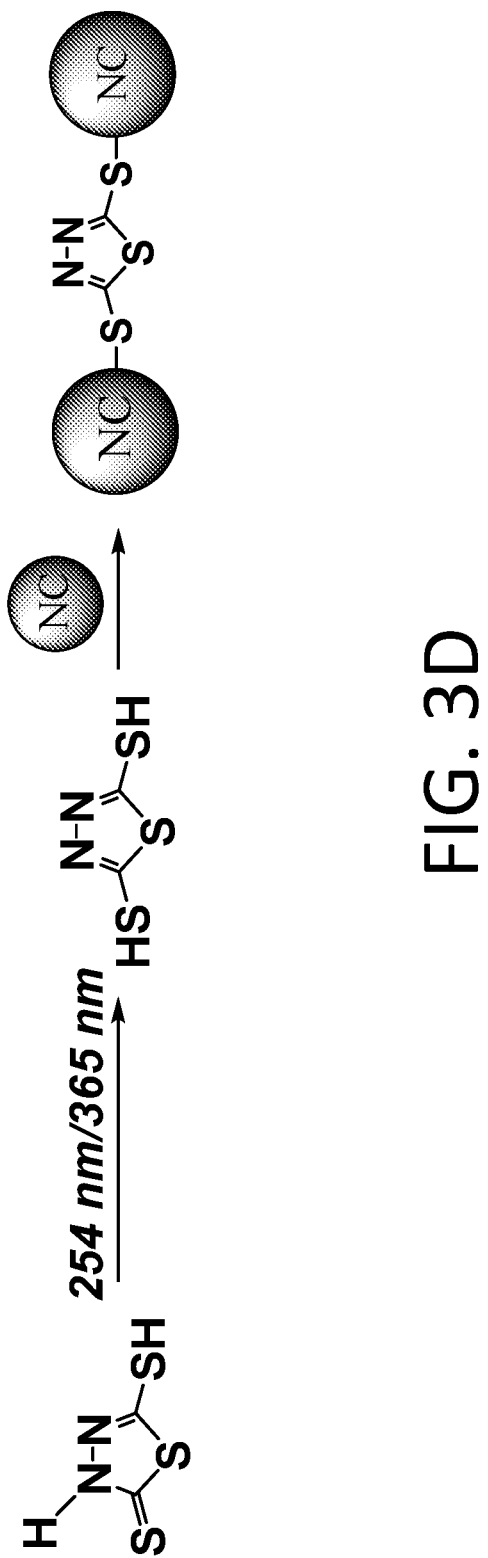
FIG. 3D shows proposed patterning mechanisms for 1,3,4-Thiadiazole-2,5-dithiol (TDD).

It is shown that NCs capped with ADC, DTC, MTT, or PEX can be formulated for DUV lithography. The NCs inks containing ligands of HCD, DTO, TDD, or HNT enable patterning with both DUV and 365 nm (i-line) light, while DNQ as an additive is used to prepare NCs inks for 365 nm (i-line) light and 405 nm visible (h-line) light pattering. The chemical structures of these specific ligands are shown in FIGS. 3A and 3B and in Table 1. Proposed decomposition mechanisms for ADC, MTT, and PEX are shown in FIG. 3C. A proposed patterning mechanism for TDD is shown in FIG. 3D. Selected molecules cleanly decompose to small, typically volatile fragments (Schemes 1-7 in FIG. 3B). The chemical transformation pathways are systematically studied by using Fourier transform infrared spectroscopy (FT-IR), electrospray ionization mass spectrometry (ESI-MS) and nuclear magnetic resonance (NMR). While FIGS. 3A and 3B provide specific illustrative capping ligands, FIG. 1C shows more general structures of these and other types of ligands that can be used as capping ligands in the DOLFIN and DELFIN NC film pattering methods described herein.

The uniqueness of each ligand system was investigated. NCs inks with the ligands of this example show several features: NC inks with DTO ligands photodecompose into a gaseous reaction product and exhibit a clean photolysis pathway with no chemical residues as side-products after the exposed step; PEX type inks have very high sensitivity, enabling NC patterning with a low exposure dose of ~30 $mJ/cm^2$; NCs capped with DTC ligands show high solubility in environmentally benign and industrially accepted solvents, such as acetone; core-shell NCs like CdSe/CdS, CdSe/ZnS, InP/ZnS capped with ADC and/or TDD ligands retain their high photoluminescent (PL) efficiencies. The realization of sub-700 nm features for patterned oxide NCs using HNT chemistry is demonstrated. Also demonstrated is the use of DELFIN to achieve sub-100 nm features with fewer processing steps compared with traditional EBL.

Finally, new ligands are shown to not only pattern inorganic NCs, but also support high optical properties and electrical conductivity in NC solids.

TABLE 1

Compatibility ligands for different cores and patterning conditions

| Ligand | Materials | Solvents | Developers | Dose ($mJ/cm^2$) |
|---|---|---|---|---|
| ADC | CdSe, CdTe, CdSe/CdS, CdSe/ZnS, InP/ZnS | DMF, NMF, DMSO | DMF, NMF | 100 (254 nm) |
| DTC | CdSe, CdTe, FePt, HgTe | DMF, NMF, DMSO | Acetone, DMF, NMF, DMSO | 150-180 (254 nm) |
| MTT | CdSe, CdTe | DMF, NMF, DMSO | DMF, NMF, DMSO | 100 (254 nm) |
| PEX | CdSe, CdTe, Au | DMF, NMF, DMSO | DMF, NMF, DMSO | 31.5 (254 nm) |
| DTO | CdSe, CdTe, $CeO_2$, $ZrO_2$ | DMF, NMF, DMSO | DMF, NMF, DMSO | 100 (254 nm)<br>225 (365 nm) |
| HCD | CdSe, CdTe, CdSe/CdS, CdSe/ZnS, InP/ZnS, PbS, HgTe | DMF, NMF, DMSO | DMF, NMF, DMSO | 100-150 (254 nm)<br>80-100 (365 nm) |
| TDD | CdSe, CdTe, CdSe/CdS, CdSe/ZnS, InP/ZnS | DMF, NMF, DMSO | DMF, NMF, DMSO | 100-150 (254 nm)<br>80-100 (365 nm) |
| HNT | $CeO_2$, $ZrO_2$, FePt | DMF, NMF, DMSO | DMF, NMF, DMSO | 80 (254 nm)<br>600 (356 nm) |
| DNQ | CdSe, $CeO_2$, $ZrO_2$ | DMF, NMF, DMSO | DMF, NMF, DMSO, TMAH | 400 (365 nm)<br>400 (405 nm) |

Photosensitive Surface Ligands that Leave No Organic Residues after Light Exposure Ligand-capped NCs were obtained by exchanging organic ligands at the surface of as-synthesized NCs with the inorganic molecular species. The broken bonds at NC surfaces exhibited chemical reactivity toward the electron-rich groups of surface ligands, engineered to provide colloidal stability of NCs in desired solvents. For direct optical patterning, photosensitive ligands should be applied to functionalize NCs, without compromising their functional properties.

The ligands used in this example have two characteristics that make them useful for patterning films of inorganic-capped NCs: (1) the inorganic anions are able to replace insulating, long-chain native organic ligands on the NCs with charged small inorganic anions, providing electrostatic stabilization in polar solvents; and (2) the ligands contain a photosensitive compound which changes the solubility of the NC film after irradiation.

Two types of inks were made. The first type of ink was a single-ligand system that utilized bifunctional ligands. The beauty of this system was the simplicity of the surface chemistry, where one single ligand could perform two functions simultaneously; i.e., the ligand both stabilized the NCs and was itself photosensitive. The second type of ink utilized a two-component ligand system to perform the above functions separately; the first component was a stabilizing anion (the ligand part of the system) that stabilized the NC colloid while the second component was a photosensitive moiety that changed the NCs solubility in solution upon irradiation (FIG. 3B, schemes 8-11). Compared with the first type of ink, the biggest advantage of the second type was its flexibility. By changing the combination of two components, various inks could be prepared to satisfy special needs in term of wavelength, solvents, etc.

For the bifunctional ligand-based inks, six ligands were used: ADC, MTT, PEX, DTC, TDD, and DTO (FIG. 3A). In polar solvents such as DMF, NMF, and DMSO, these ligands dissociate into positive and negative ions. The anions ($NH_2CS_2^-$ in ADC, $C_2H_3SN_3^-$ in MTT, $C_3H_5S_2O^-$ in PEX, $C_5H_{11}S_2N^-$ in DTC, $C_2S_3N_2H^-$ in TDD, and $C_2S_2O_2^{2-}$ in DTO) served as nucleophilic groups that bonded to the undercoordinated metal atoms on the NC surface, while the smaller cations (e.g. $NH_4^+$, $Na^+$, $K^+$, $N_2H_5^+$, etc.), served as counter-ions, forming a diffuse cloud around the NCs. This condition was corroborated by the negative zeta-potential measurements of the colloidal solution. During film deposition and drying, the cations re-associated with their corresponding anions in order to preserve charge neutrality. Upon irradiation, these ligands decomposed to small molecules that could no longer provide colloidal stabilization, thus reducing the NC solubility in the polar solvents.

Figures 4A, 4B, 4C:
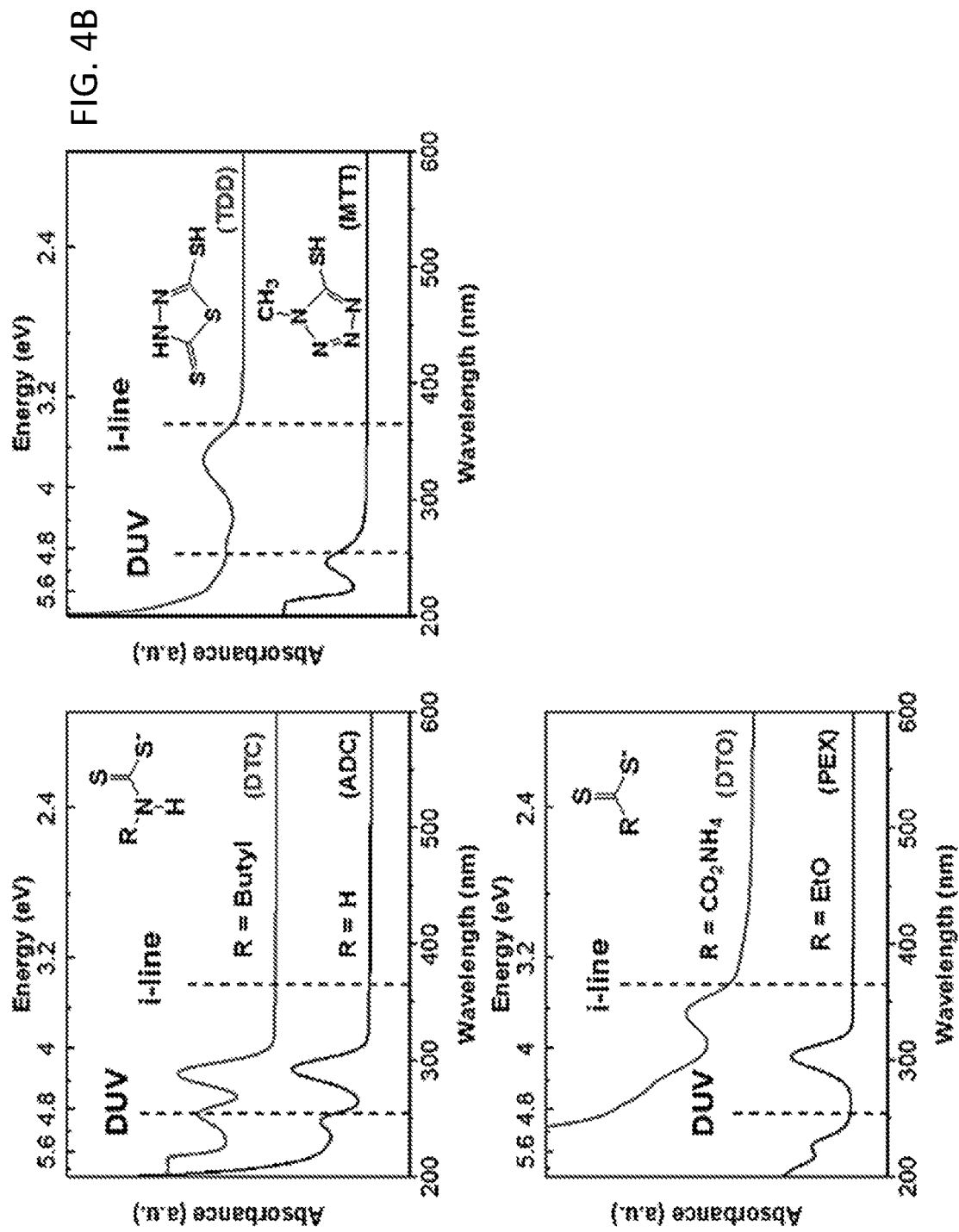
FIGS. 4A-4D. Absorption spectra of pure ligands in MeOH.

The dithiocarbamates ADC and DTC show pronounced UV absorption bands with spectral positions affected by substitution groups. FIG. 4A shows the comparison of the absorption spectra of pure ADC and DTC ligands in MeOH. The molar extinction coefficients of these ligands at their reddest absorption peaks are $\varepsilon(292\ nm)=1.3*10^4\ M^{-1}\ cm^{-1}$ for ADC and $\varepsilon(287\ nm)=7.9*10^3\ M^{-1}\ cm^{-1}$ for DTC. The absorption of ADC and DTC ligands matches reasonably well to the DUV wavelength. Depending on the substitution group, dithiocarbamate derivatives can undergo different photochemical decomposition pathways. Upon irradiation, these ligands decompose to small molecules that can serve as X-type (SCN) and L-type ($BuNH_2$) ligands to passivate dangling bonds and trap states at the NC surface (FIG. 3B, schemes 1 and 2).

The azoles MTT and TDD were used as examples of azole bifunctional ligands for DOLFIN film patterning. Their photo induced decomposition pathways are shown in FIG. 3B, schemes 3 and 6. After MTT was irradiated, it decomposed into $CH_3N=C=NH$, which no longer provided colloidal stability in polar solvents. In contrast, TDD underwent a photo-induced tautomerization from a thione-thiol to a dithiol form, which bridges neighboring NCs, and led to decreased solubility in polar solvents. MTT absorption is well-matched to the DUV wavelength, while TDD absorbs both DUV and i-line photons (FIG. 4B). As a result, MTT-capped NCs can be patterned with DUV photons while TDD-capped NCs can be used for both DUV and i-line DOLFIN.

PEX and DTO were used as examples of xanthate and thiooxalate bifunctional ligands, respectively. CdSe NCs capped with $EtOCS_2^-$ ligands were prepared using PEX in DMF or NMF, and the solutions retained excellent colloidal stability for weeks. In the case of DTO, the chemically soft dithiocarboxylate site ($RCSS^-$) or hard carboxylate ($RCOO^-$) replaced organic ligands on the NC surface. Stable colloids of the NCs were obtained in DMF and NMF through a one-phase ligand exchange procedure. The generality of this approach was established for a wide range of colloidal NCs, including CdSe, CdTe, $CeO_2$, and $ZrO_2$.

Similar to the dithiocarbamate ligands and azole ligands, both the xanthate and thiooxalate ligands were sensitive to UV light (FIG. 3B, schemes 4 and 7). As shown by their absorption spectra in FIG. 4C, PEX with the absorption coefficient of $1.8*10^4\ M^{-1}\ cm^{-1}$ at 302 nm is sensitive to DUV light, while DTO ($\varepsilon_{(346\ nm)}=1.5*10^4\ M^{-1}\ cm^{-1}$, in $H_2O_2O$) absorbs both DUV and i-line photons.

For the two-component ligand systems, films of $BF_4^-$-capped "bare" NCs were patterned, where "bare" NCs refers to NCs from which the organic native ligands have been stripped. The $BF_4^-$ ions formed a diffuse cloud around the NC surface and provided colloidal stability by an electrostatic mechanism to various types of NCs, leaving a "bare," positively-charged NC surface in the polar solvents, as confirmed by a positive zeta-potential. It was also demonstrated that the family of PAGs was compatible with this system. Non-ionic and ionic PAGs such as HNT and DNQ, respectively, were added to both tight-binding anion and $BF_4^-$-stabilized NC solutions, with a typical concentration of about 2.5-20 weight percent (wt. %) of the NCs. After deposition and irradiation, these PAGs formed an acidic moiety which altered the solubility of the NCs.

AST and AIT ionic salts were used to provide cationic PAGs. These salts released triflic acid upon DUV irradiation (FIG. 3B, schemes 8 and 9). The role of the bulky PAG cation as a spacer was evident when compared with triflic salts of smaller cations: a $CeO_2$ NC film containing AST easily redissolved in DMF after vacuum drying (without UV exposure), while films of the same NCs with sodium or silver triflate salts did not. Small-angle X-ray scattering measurements of films containing the PAG also showed a relatively large increase in NC spacing (~1 nm) compared to films without the PAG. Subsequent UV irradiation of the PAG cleaved a Ph-S bond and formed reactive protons that interacted with either the surface ligands or NC surface, rendering particles insoluble in DMF.

Figure 4D:
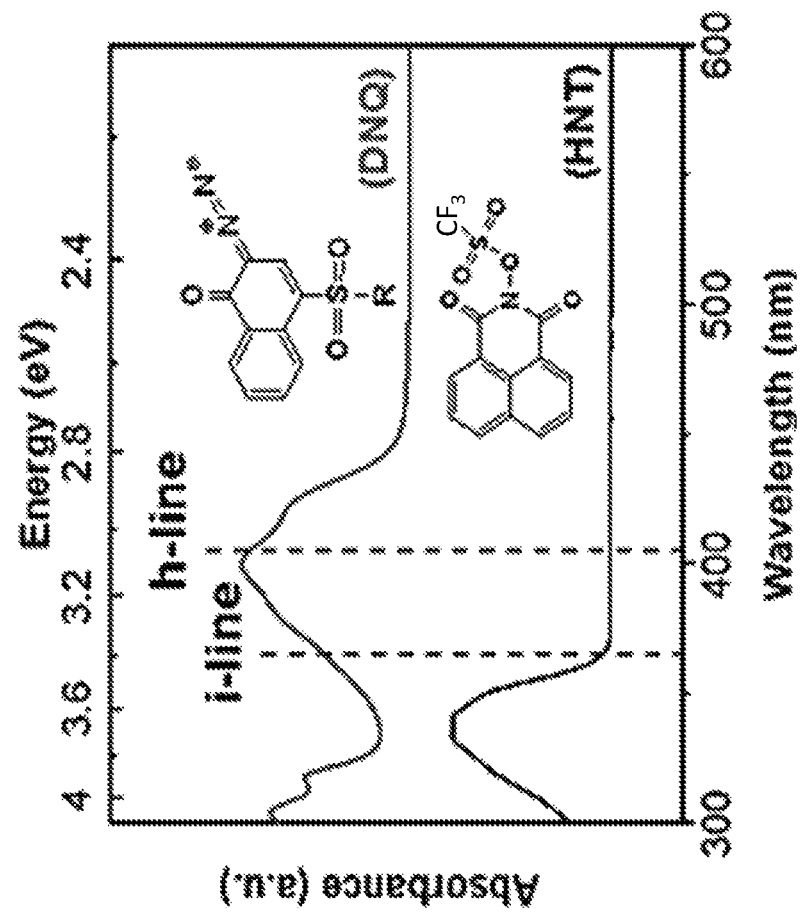

Another ionic PAG utilized was DNQ, which has a broad absorption band spanning 340-450 nm. Dissolving DNQ in nonanhydrous DMF allowed DNQ to hydrolyze with ambient water vapor to form the corresponding sulfonic acid. With the assistance of irradiation (365 nm or 405 nm light), DNQ molecules further produced a carboxylic acid moiety with the release of $N_2$ (FIG. 3B, scheme 11; FIG. 4D; and FIG. 7A). These two binding sites (sulfonate and carboxylate) can attach to neighboring NCs, thereby reducing the NC dissolution rate during development. It is of interest to note that moving the 4-sulfonyl group to the 5- or 6-position will further red-shift the wavelength sensitivity up to 500 nm.

HNT was sensitive to 365 nm light and liberated triflic acid by cleaving the N—O bond (FIG. 3B, scheme 10; and FIG. 4D). By simply mixing HNT with "bare" $CeO_2$ NCs, the resulting ink can be directly implemented in the DOLFIN process. The patterning mechanism is attributed to changes in local ionic concentration, which compresses the electrostatic double layer around the NCs, reducing repulsion between NCs and resulting in a slower dissolution rate.

Figure 10A:
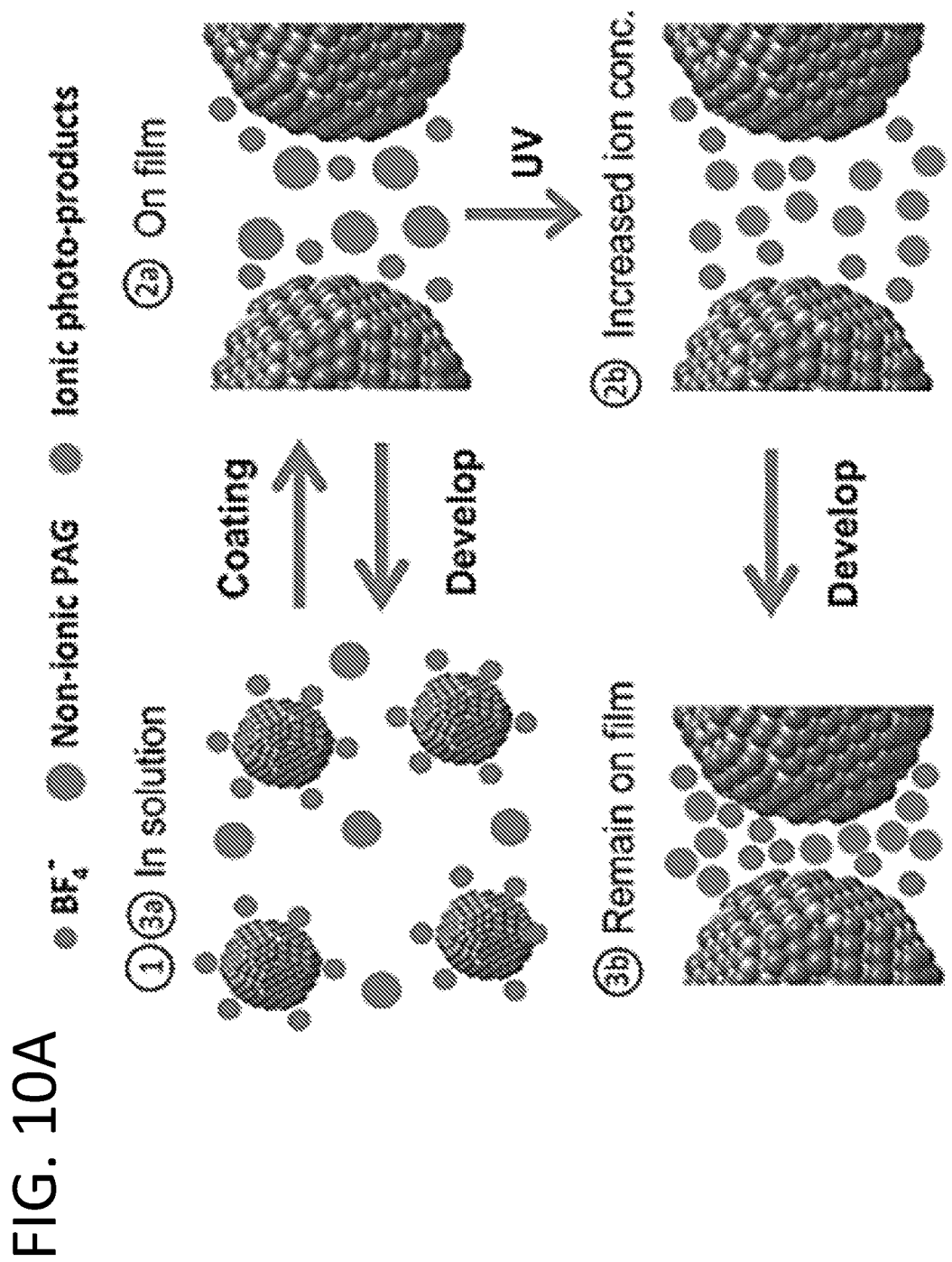
FIG. 10A. Schematic of non-ionic photoacid generator (PAG) DOLFIN.
Figure 10B:
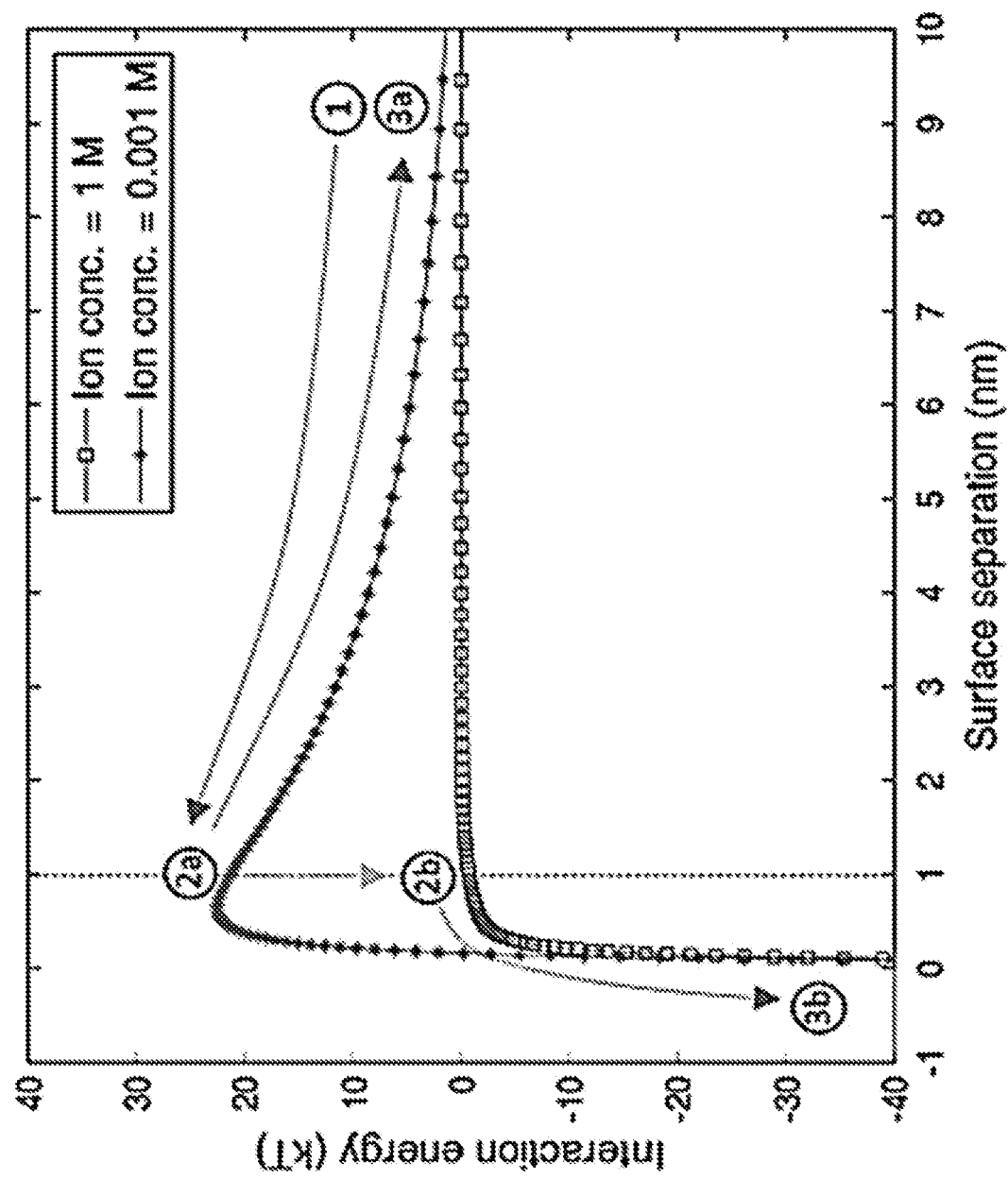
FIG. 10B. Numerically calculated interaction energy (DLVO) curves for 1.3 nm CeO$_2$ NCs in solutions of two different ionic concentrations; low concentration (0.001 M) represents the condition of NC inks before irradiation; high concentration (1 M) represents the condition of NC inks after irradiation.

Proposed step-by-step changes during the DOLFIN process using non-ionic PAGs are illustrated in FIGS. 10A and 10B, which use numerically calculated DLVO interaction energy. In a solution of $CeO_2$ NCs and HNT, the electrostatic double layer repulsion dominates, which prevents particle aggregation (FIG. 10A, (step 1)). In the film-formation step, the solvent evaporates, forcing the particles to approach each other and settle into a randomly-packed structure with surface-to-surface separation equaling the size of the PAG (FIG. 10A, step 1→2a). Upon UV irradiation, the local ionic concentration in the film increases significantly which reduces the electrostatic repulsion between NCs, leading to the removal of the barrier in the interparticle interaction energy (FIG. 10A, step 2a→2b). This allows the NCs to come much closer together, sinking into a deep potential well and becoming insoluble during development (FIG. 10A, step 2b→3b). On the other hand, the regions of NC film that were not exposed to UV light reestablish the double layer repulsion during the development step, allowing NCs to easily separate from one another and dissolve into the developing solvent (FIG. 10A, step 2a→3a).

The ligands used for NCs patterning showed different absorption spectra (FIGS. 4A-4D), spanning different regions in the UV-blue range (200 nm to 450 nm). According to the optical properties, these ligands could be divided into three groups: solely sensitive to DUV light (MTT, PEX, ADC, DTC, and sulfonium triflate); sensitive to both DUV and i-line (365 nm) photons (TDD, DTO and HNT); and sensitive to both i-line and h-line (DNQ). Most of the ligands were compatible with CdSe NCs and were typically compatible with other semiconductor NCs (for example, CdTe, CdSe/ZnS, InP/ZnS), oxide NCs ($CeO_2$ and $ZrO_2$) and/or metal NCs (for example, FePt and Au), as shown in FIG. 4C. All the NCs inks were characterized by UV-Vis, transmission electron microscopy (TEM), powder X-ray diffraction (PXRD), and FT-IR measurements. Table 1 summarizes the explored NC-ligand combinations and basic patterning conditions, such as deposition and developer solvents, exposure wavelength, and dose.

Patterning with DUV Light (254 nm).

Figures 5A, 5B:
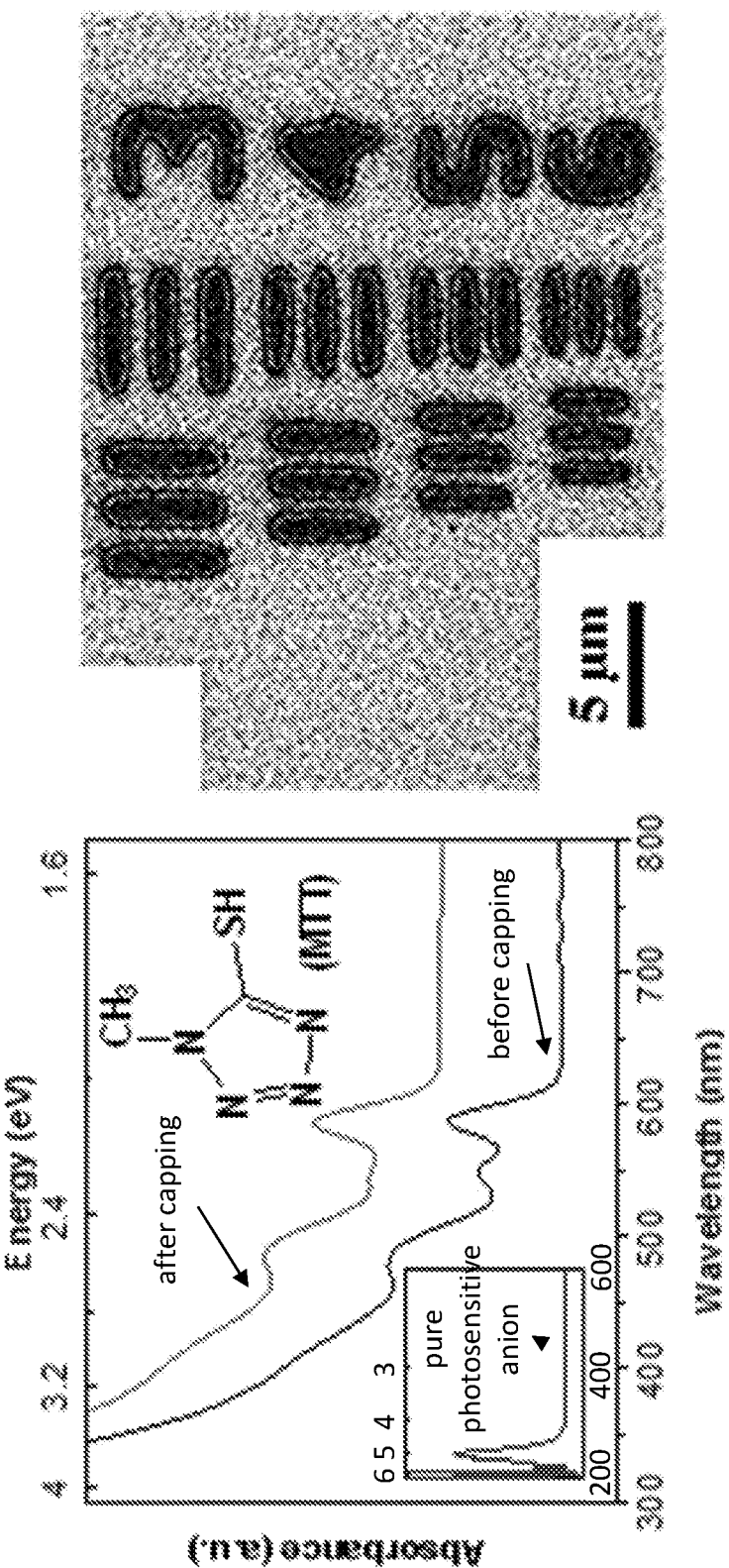
FIGS. 5A-5J. Examples of NCs patterned with 254 nm exposure. Absorption spectra of pure photosensitive anions in MeOH and wurtzite (Wz)-CdSe NCs before and after capping with photosensitive anions in dimethylformamide (DMF) (FIG. 5A, MTT.
Figures 5C, 5D:
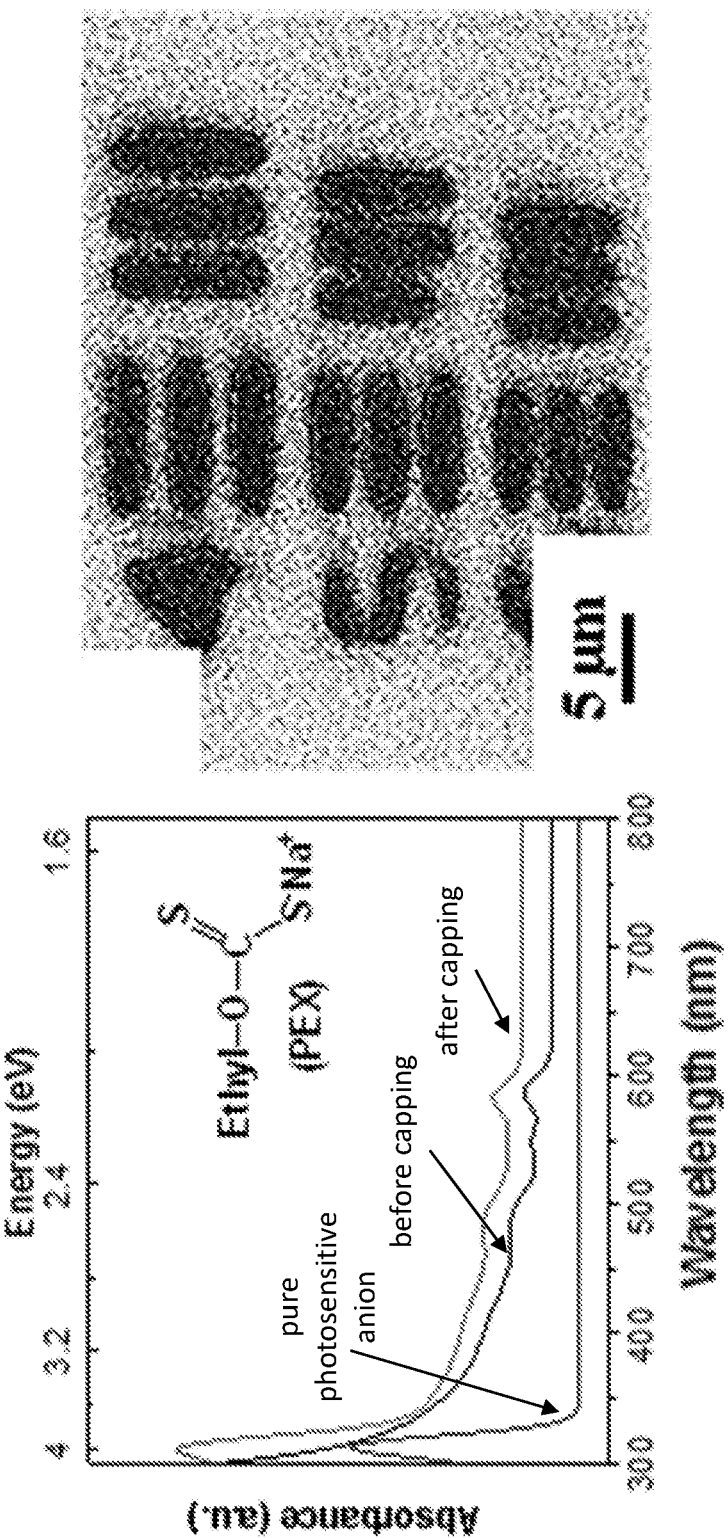
Figure 5E:
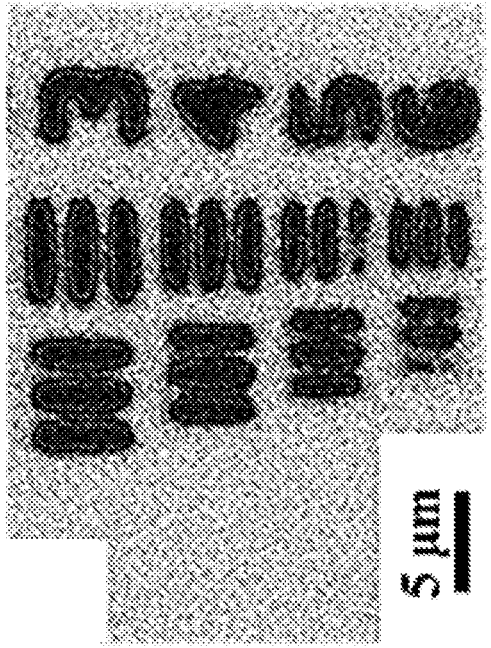

Ligands which work exclusively for patterning with 254 nm exposure are MTT, PEX, ADC, DTC, and sulfonium triflate. MTT, PEX, ADC, and DTC ligands bind directly to semiconductor surfaces, without affecting the absorption features of the NCs (FIGS. 5A, 5C, 5E, and 5I). The SEM images in FIGS. 5B, 5D, 5F, and 5J were the patterns obtained from CdSe NCs capped with various ligands. It is worth noticing that the quality of each pattern was slightly different although the starting NCs were the same, which indicates that the resolution and sensitivity of the inks were determined by the photosensitive surface ligands. As shown in FIG. 5B, the smallest feature achieved was 1 μm using the MTT capped NCs with the exposure dose of 100 mJ $cm^{-2}$, while the most sensitive ink contained PEX-CdSe NCs, where a clear loss of colloidal stability was observed after 254 nm exposure with a dose of 31.5 mJ $cm^{-2}$. Each of these ligands also has particular features which may be useful depending on the desired application. For the DTC ligand, acetone (instead of the typically-used DMF) can be used both as a solvent and developer. Since acetone is a more widely industrially used solvent, this feature can be particularly important for process scale up. The advantage of ADC-based NCs ink was pronounced when the ligand was introduced to treat CdSe/CdS core-shell NCs. Thus, CdSe/CdS core-shell NCs stabilized by ADC preserved bright emission in DMF and other polar solvents.

Besides the aforementioned single-ligand system, a two-ligand system can also be applied to design NCs inks. For example, sulfonium triflate ligands were utilized for "bare" oxide (e.g., $CeO_2$) NC inks. Bare NCs obtained by a native ligand stripping treatment exhibited several advantages. By this method, various NCs could be stabilized in polar media with no impurities introduced during the ligand exchange. Moreover, the bare NCs could be further functionalized by various capping ligands through a secondary ligand-exchange process. Colloidal stability of bare NCs was provided by $BF_4^-$ ions, electrostatically associated with the positively charged surface metal centers. DMF molecules acted as co-ligands, necessary for colloidal stabilization. The exposed PAG generated strong triflic acid which could protonate DMF, weakening the coordination and rendering the NCs insoluble in polar solvents. The quality of the patterns was evaluated by the resolution, sensitivity, and line edge roughness (LER). A 1951 U.S. Air Force target was introduced to estimate the smallest features that could be resolved. The SEM image in FIG. 5G demonstrated that the high contrast features obtained from the $CeO_2$ ink had a resolution of 700 nm with 100 mJ $cm^{-2}$ dosage. The LER was determined by an SEM image, in which the edges of the patterned regions were sharp and clean with roughness around 50 nm. The good fidelity, another parameter to verify the quality of the patterns, was demonstrated by patterning 5 μm width of $CeO_2$ NCs stripes consecutively on top of each other in FIG. 5H.

Patterning with i-Line (365 nm) Photons.

Photolithography using lower energy photons (e.g. 365 nm and 405 nm) generally involves lower energy consumption and unintended sample damage, while also enabling deeper light penetration into the patterned layers. Furthermore, this wavelength region is more commonly used in research grade photolithography equipment, making new NC inks patternable with 365 nm light highly desirable. These benefits come at the expense of ultimate resolution due to the Abbe diffraction limit, which is not a limiting factor for patterned NC layers for LED pixels, optical gratings, photoconductor arrays, and other applications. Among all studied ligands, TDD, DTO, and HNT are suitable candidates along these lines.

Figure 5F:
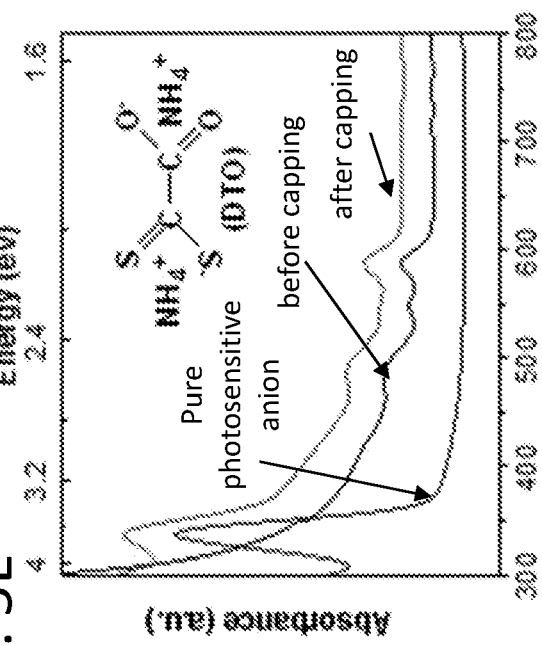
Figure 5G:
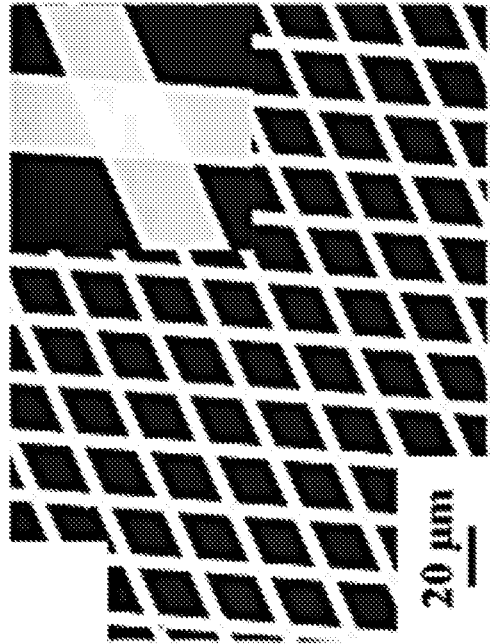
Figure 5H:
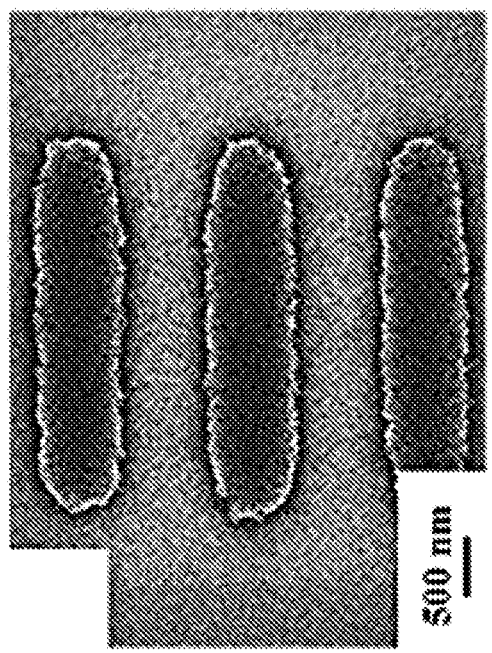
Figures 5I, 5J:
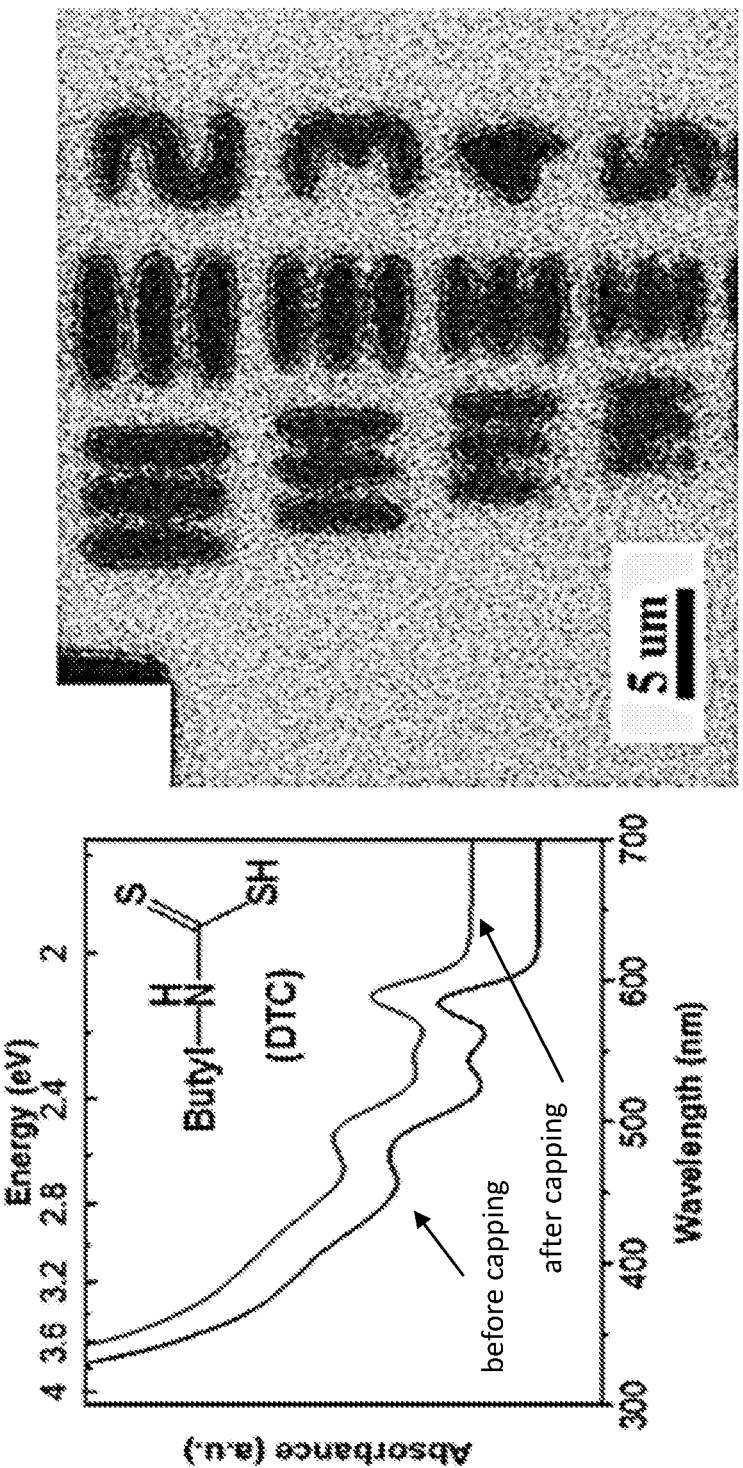
Figure 6A:
FIGS. 6A-6E. DOLFIN patterning with 365 nm photons.

In solution, these ligands do not change the absorption features of the NCs (FIG. 6A), while enabling the patterning of 1 μm-spaced features with 365 nm light (FIGS. 6B-6E). Dosages, however, vary depending on the ligand—DTO: 225 mJ/$cm^2$, TDD: 80-100 mJ/$cm^2$, HNT: 500-600 mJ/$cm^2$. The same ligands can also be used for 254 nm patterning. For example, the pattern of DTO capped CdSe NCs with comparable resolution was obtained with dosages of 100 mJ/$cm^2$, as shown in FIG. 5F.

Figure 6B:
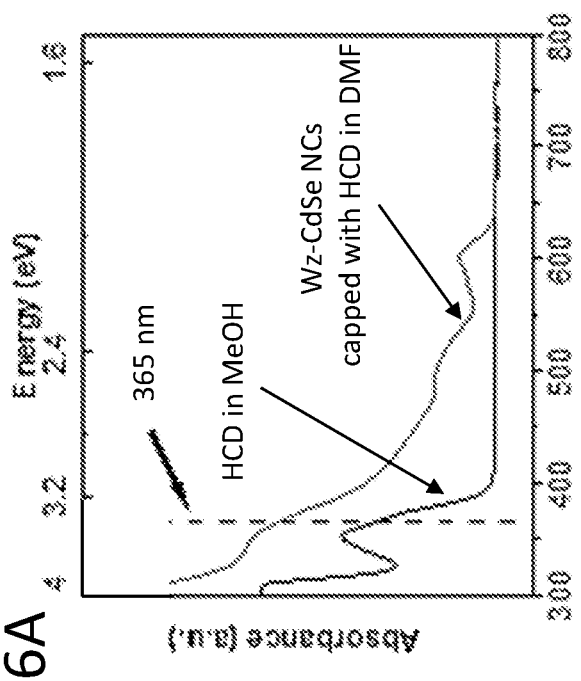
Figure 6D:
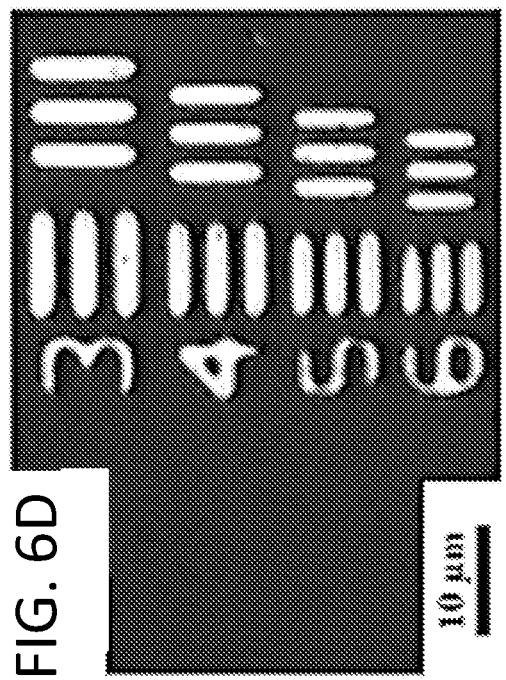
Figure 6C:
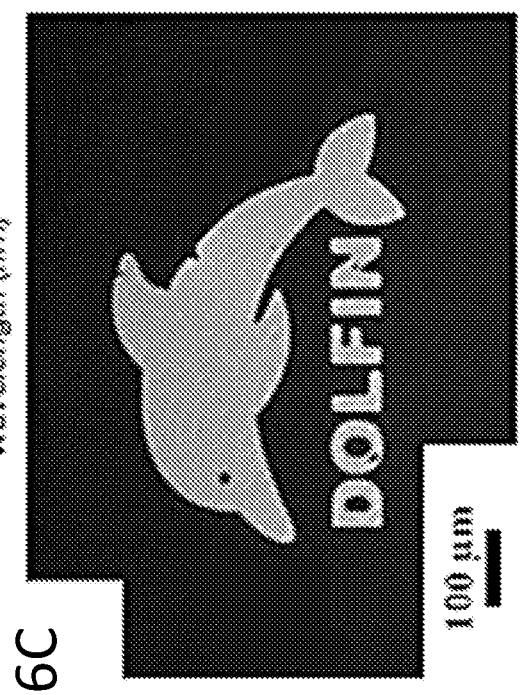

More importantly, the DTO ligand has clean photolysis chemistry, decomposing into $CS_2$, $CO_2$ and $NH_3$ gases with the assistance of QDs upon exposure to UV light. This means that no chemical side-products remain in the film after the photolithography step. The second benefit of the DTO ligand is its versatility as a capping agent. For example, the DTO ligand can be used to stabilize oxide NCs, like $CeO_2$ and $ZrO_2$ NCs. This capability is attributed to the two types of functional groups in the DTO ligand, dithio-site (S terminated) and dioxalate-site (O terminated). Since both sites can serve as bridges to bind with NCs, the DTO ligand can be introduced to functionalize not only semiconductor NCs but also oxide NCs. The solubility changes were observed when the DTO capped NC inks were exposed to 365 nm UV light. For example, the smallest feature was successfully obtained from $CeO_2$-DTO NCs inks with 225 mJ/$cm^2$ exposure dose (FIG. 6D).

Figure 6E:
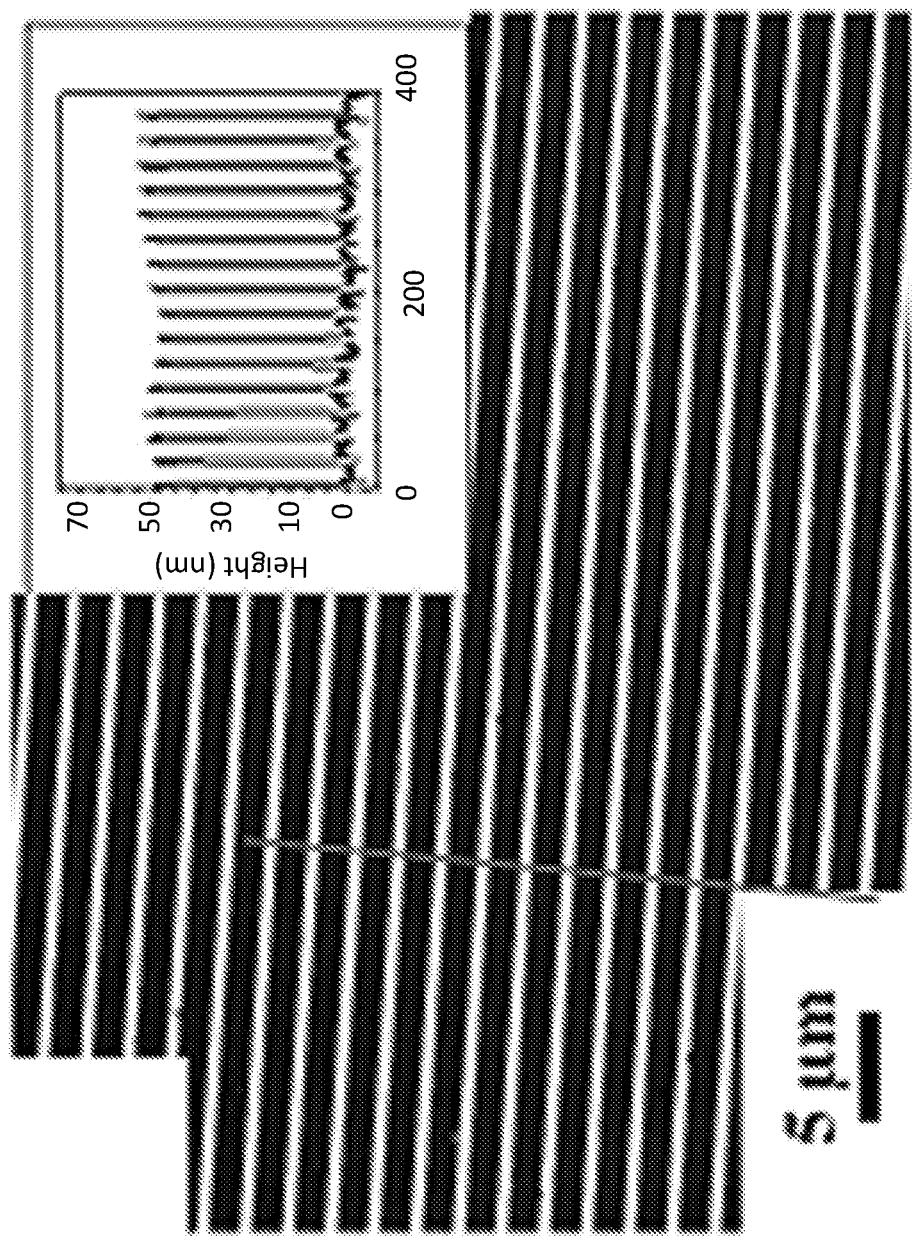

TDD is another ligand that can be applied to prepare DOLFIN inks for i-line lithography. Similar to ADC, the advantage of TDD based NCs ink was pronounced when the ligand was introduced to pattern core-shell NCs. The core-shell CdSe/ZnS NCs stabilized by TDD preserved a bright emission, with over 60% photoluminescence quantum yield (PLQY) in polar solvents. With a dose of 80-100 mJ/$cm^2$, highly luminescent InP—ZnS and CdSe—ZnS NCs were patterned (FIGS. 6B and 6E).

$BF_4$ capped $CeO_2$ NCs were used to form i-line DOLFIN ink as well. In this case, HNT, as a typical i-line sensitive PAG, was introduced. The patterned features indicated efficiently resolved sub-micron lines, comparable to those of DUV lithography. However, with the same concentration of PAGs in inks (2.5% by weight), the required dose for patterning under a 365 nm condition was 500-600 mJ/$cm^2$, larger than that of 254 nm. This is because the absorption coefficient of HNT at 365 nm was four times smaller than that at 254 nm, and the overall acid releasing efficient was smaller, which in turn impeded the pattern ability of NCs inks and lowered the sensitivity.

Patterning with h-Line (405 nm) Photons

The patterning of inorganic NCs with 254 nm and 365 nm light has been demonstrated. However, direct h-line lithography of NCs has yet to be reported, mainly due to the lack of suitable photosensitive molecules; most inorganic anions and PAGs do not typically absorb at 405 nm. DNQ is a photosensitizer for 365 nm and 405 nm patterning. Upon irradiation, DNQ decomposes into an indene carboxylic acid, which increases the solubility of the photoresist in an aqueous base solution.

Figure 7B:
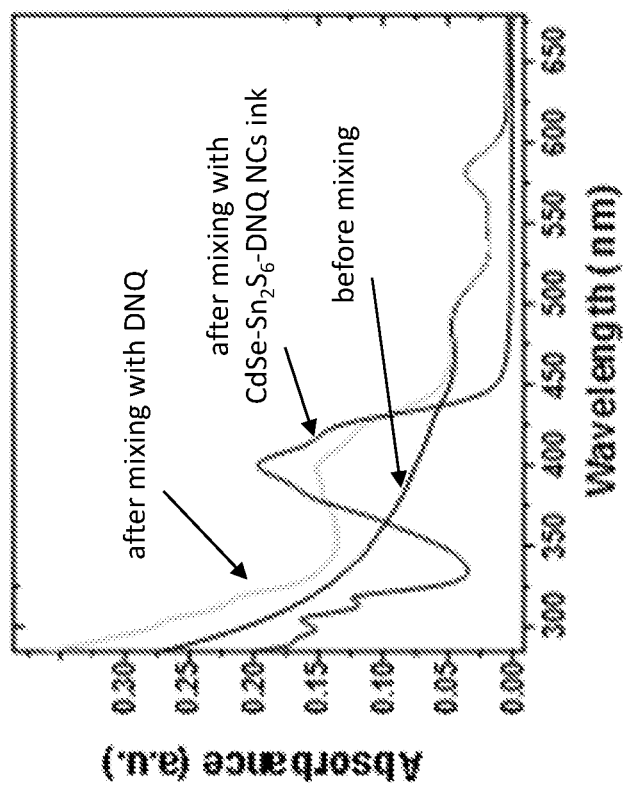
FIGS. 7A-7D. DOLFIN patterning with 405 nm photons. Absorption spectra of (FIG. 7A) DNQ ligands in DMF before and after photodecomposition, and (FIG. 7B) Wz-CdSe—Sn$_2$S$_6$ NCs before and after mixing with DNQ, (FIG. 7A) and the CdSe—Sn$_2$S$_6$-DNQ NCs ink (FIG. 7B). Optical microscopy images of equal spacing strips patterns obtained from CeO$_2$ NCs ink (FIG. 7C) and CdSe NCs ink (FIG. 7D) by 405 nm light with the assistant of DNQ.
Figure 7A:
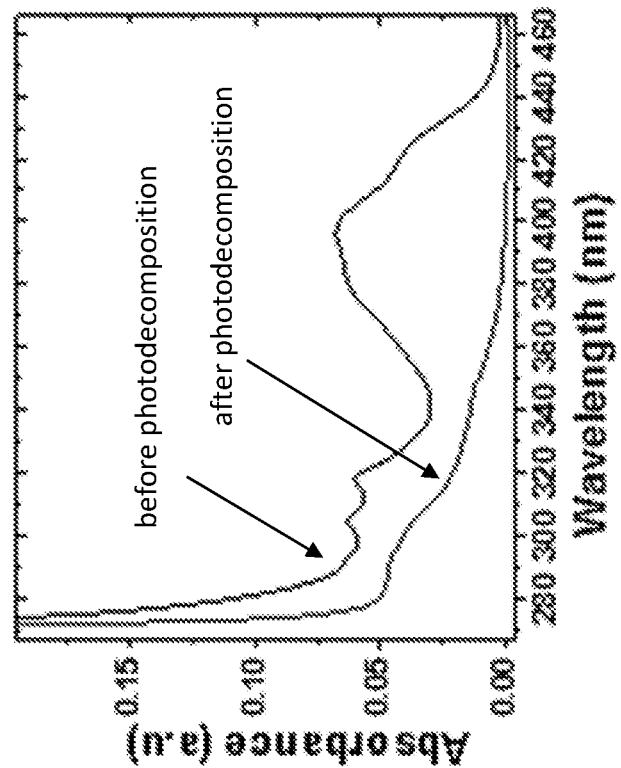

Here, it is demonstrated that NCs could be functionalized with DNQ to form a photosensitive ink which was patternable using visible 405 nm light. The as-purchased compound DNQ was first dissolved in anhydrous DMF, forming a DNQ-DMF$^+$ Cl$^-$ salt (Eq. 1). The DNQ-DMF$^+$ Cl$^-$ compound had a broad absorbance feature between 340-450 nm, which was flattened upon irradiation by 405 nm light (FIG. 7A). Since this compound was unable to directly provide electrostatic stabilization, the NCs were first stabilized in DMF using BF$_4^-$ (CeO$_2$ NCs) or Sn$_2$S$_6^{4-}$ (CdSe NCs). The DNQ-DMF$^+$ Cl$^-$ salt was then added to the NC solution in small amounts (less than 20 wt. % of the NCs) to form the photosensitive NC ink. The absorption spectra of a CdSe—Sn$_2$S$_6$ NCs before and after the addition of the DNQ showed that the properties of the NCs were preserved (FIG. 7B).

Figures 7C, 7D:
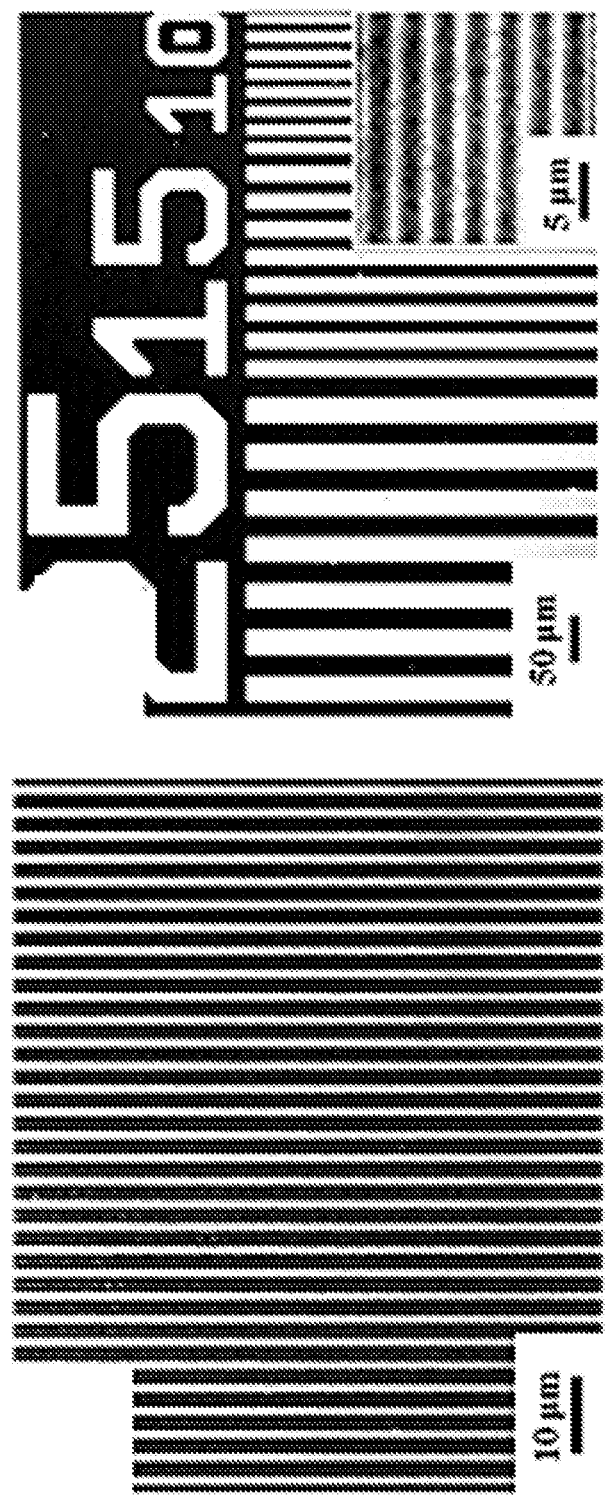

Positive-tone patterns (i.e., the non-illuminated part was dissolved during development) were formed using both CeO$_2$—BF$_4$-DNQ NCs and CdSe—Sn$_2$S$_6$-DNQ NCs (FIGS. 7C and 7D, respectively) with 405 nm light. DMF was used to develop the oxide NCs films, whereas 0.05 M tetramethylammonium hydroxide (TMAH) aqueous solution was used to develop the semiconductor films. Both of these systems yielded resolvable 1.5 μm line-space (LS) features (1.5 μm lines with 1.5 μm spacings), which were the smallest features on the masks. Typical dosages were around 400 mJ/cm$^2$, but smaller dosages (<50 mJ/cm$^2$) are possible.

DELFIN

EBL is a powerful technique for ultra-small electronic fabrication, using a focused electron beam for direct-write patterning. EBL enables much better resolution compared to traditional photolithography because the beam can be focused down to a sub-nanometer scale as a result of its extremely short wavelength (0.2-0.5 Å). Hence, the diffraction effects on the resolution limitation in photolithography would be greatly diminished, smaller patterns. Here, DELFIN was demonstrated, which can address these fundamental problems and be used to obtain sub-100 nm features in one step without sacrificing the optoelectronic properties of the NCs.

The DELFIN process requires e-beam sensitive NC inks. Since PAGs are sensitive to e-beam exposure, the PAG-type positive tone DOLFIN inks could be directly used here. Upon exposure, the PAGs decomposed, forming strong acid through the electron-beam-induced radical reaction (Eq. 2). Such acids subsequently bound with either the ligands or the NC surface, causing the NCs to lose colloidal stability. When soaked in polar solvents like DMF or NMF, the unexposed area readily redissolved, while the exposed regions stayed on the substrate, forming a positive pattern. The residual PAG molecules were also removed in this solvent development step.

FIGS. 8A and 8B show SEM images of patterned CeO$_2$ NCs with well resolved 50 nm and 30 nm widths and without any pattern collapse, obtained under the same aperture size (I$_{current}$=17.6 pA) but with various doses, from 150 to 200 μC/cm$^2$. Larger size patterns, including 300 nm and 100 nm, could also be obtained with dosages of 80 and 100 μC/cm$^2$, respectively. Patterning smaller features required a higher dose, which may be due to the fact that the high dose can effectively avoid blur during the exposure. Considering the nanoparticle size of 2 nm determined by DLS and the film thickness of 50 nm measured by a confocal optical surface metrology microscope, the ultimate resolution feature that could be acquired by DELFIN consisted of a stack of about 15 nanoparticles in width and 25 nanoparticles in height. The LER was around 5 nm, equal to the size of two single nanoparticles. The clean background and sharp pattern edge observed from the enlarged SEM images in FIGS. 8A and 8B demonstrate not only the high-resolution capabilities of the inorganic inks, but also their remarkable sensitivity.

Besides oxide NCs, semiconductors could also be patterned by the DELFIN process. As shown in FIG. 8C, 100 nm line width features were obtained from the inks of CdSe NCs capped with Sn$_2$S$_6^{4-}$ ligands and Ph$_3$S$^+$ PAG on a Si/SiO$_2$ wafer with the dose of 80-100 μC/cm$^2$. The ultimate resolution limits evaluated from the SEM images turned out to be 70 nm. Since the size of CdSe NCs was around 5 nm and the thickness of the film was around 40 nm, the resolution feature of CdSe NCs that could be acquired by DELFIN consisted of a stack of about 12 nanoparticles in width and 8 nanoparticles in height. More importantly, under the same e-beam conditions, 100 nm patterns of CdSe—ZnS core-shell NCs could be achieved (FIG. 8D). After developing in NMF, such small features still showed bright luminescence, which demonstrated the possibility of applying DOLFIN inks alone with the DELFIN process to the fabrication of QD nanodevices.

Optical and Electronic Characterization of the Patterned Layers

To evaluate the practical utility of the new types of NCs inks, the properties of representative patterned metal and dielectric films were characterized. Metal NCs, such as Au NCs and Ag NCs, can be the building blocks to form interconnects in electronic circuits. A layer of Au NCs patterned using PEX ligands and then annealed at 150° C. for 20 min was shown to have exhibited very high conductivity. The conductivity of a 60-nm-thick Au film was 2.3×10$^3$ S cm$^{-1}$ at 300 K.

Solution-processed NC films of high-refractive index oxides may be patterned to create functional optical elements. To demonstrate this point, a film of bare CeO$_2$ NCs was patterned with a PAG additive (p-CH$_3$S—C$_6$H$_4$)(C$_6$H$_5$)(CH$_3$)S$^+$OTf$^-$), and the film was exposed to UV light. The film was then soaked in the DMF developing solution and annealed at 350° C. for 30 min to remove residual PAGs. The refractive index (n) was measured with ellipsometry at 632.8 nm, giving a number of 1.70. As a control, the refractive index of a film of bare CeO$_2$ NCs was measured without photosensitive additives, and the refractive index was very similar.

Figure 9:
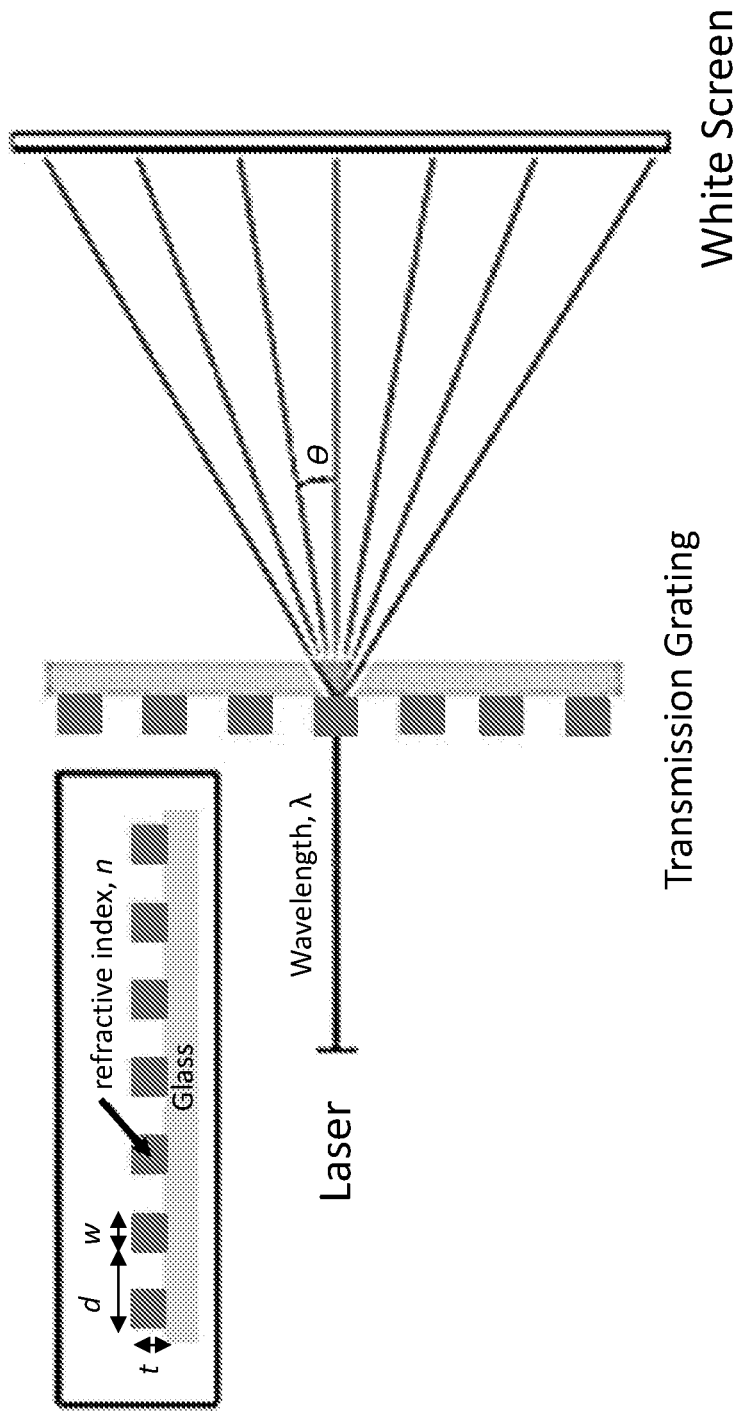
FIG. 9. Diffraction grating scheme.

Since it had achieved photosensitive, high refractive index layers, the potential of DOLFIN-patterned NC films for optical coatings was then demonstrated by fabricating diffraction gratings. Besides its widespread use in spectroscopy, gratings have also been recently used in optical biosensors and structural coloration. In particular, binary phase transmission gratings were fabricated, which consisted of alternating regions of high and low refractive index materials and were parameterized by the grating period, d; material width, w; thickness, t; and material refractive index, n (FIG. 9). When light with wavelength λ was incident on the grating, it underwent a relative phase shift between patterned and unpatterned regions of material with magnitude $$\Delta\phi = \frac{2\pi}{\lambda} \times (n-1) \times t,$$

where λ is the photon wavelength in vacuum. This periodic phase shift created a diffraction pattern in the far field, with bright diffraction orders given by the grating equation d sin θ=mλ, where d is the period spacing, θ is the diffraction angle, and m=0, ±1, ±2, etc (FIG. 9). Since the brightness of the non-zero diffraction orders increased with increasing Δϕ, it could serve as a measure of diffraction efficiency.

The binary diffraction grating prototype was fabricated in one or two DOLFIN steps. The organic ligand capped $CeO_2$ NCs were first converted into bare NCs inks with PAG as described above, then 10 μm-wide, ~150 nm-thick $CeO_2$ NCs stripes with a 25 μm period were patterned on a glass substrate as a single oxide layer to form 1D grating or two consecutive, roughly perpendicular, periodic oxide layers to form 2D gratings. These gratings have good optical transparency with no visible hazing from random scattering effects. Many high order diffraction maxima were clearly formed when irradiated with a red, green, or blue cw laser. These all-inorganic diffraction gratings had excellent thermal stabilities (tested up to 600° C.) and high optical damage thresholds.

Experimental Section

Preparation of Photochemically Active Inks.

All preparation processes were carried out in ambient conditions or in a glovebox (for sensitive materials) equipped with a yellow filter typically used for clean room lighting, purchased from Pro Lighting Group, Inc. Anhydrous solvents and a one-phase ligand exchange strategy were typically used to treat the NC surface. In a typical one-phase ligand exchange approach, the solvent in the NC dispersion was the same as that of ligands, such as acetone, or formed a homogeneous mixture with the solvent used for ligands, such as toluene/DMF or toluene/NMF. Therefore, the NC and ligand solutions were miscible when mixed, and surface ligand exchange was achieved in one phase.
NC with Photosensitive Ligands
NCs Capped with ADC and TDD Ligands.

Both ligands were used to prepare the QD inks with bright luminescence. For example, 100 μL of core-shell CdSe/ZnS NCs (40 mg/mL) was diluted into 1 mL of toluene, forming a colloidal solution, into which 100 μL of ADC (0.5 M) or TDD DMF solution (0.25 M) was added. A flocculation was observed after vortexing for several minutes, indicating a dramatic change in NC solubility caused by the surface modification. The ligand-exchanged CdSe/ZnS NCs were precipitated from the suspension by centrifugation and purified by a dissolution-precipitation procedure with DMF and toluene two times. After purification, the NCs were redissolved in 100 μL of DMF as a colloidal solution with a concentration of 30-40 mg/mL and stored in the dark in a glovebox, which kept them stable for weeks.
NCs Capped with DTC Ligands.

Using CdSe NCs (4.5 nm, wurtzite phase) as an example, 100 μL of the as-synthesized NCs (40 mg/mL) were precipitated first from toluene by adding 1.5 mL of acetone and were then re-dispersed into 0.5 mL of acetone, forming a cloudy suspension. After adding 200 μL of fresh DTC solution in acetone (0.2 M) and vortexing for 1 min, the cloudy NCs suspension turned into a red colloidal solution. The treated NCs were then precipitated by adding 2 mL of MeOH and rinsed with MeOH to remove free DTC ligands. After purification, the CdSe-DTC NCs were redissolved into 100 uL of DMF as a colloidal solution with a concentration of 30-40 mg/mL.
NCs Capped with DTO, MTT, and PEX Ligands.

The surface treatment process was similar for preparing of photosensitive inks with DTO, MTT, or PEX ligands. In general, photosensitive ligands were dissolved into NMF or DMF, forming a stable solution with a concentration of 0.2 M. In a separate vial, 100 μL of the as-synthesized NCs (40 mg/mL) was diluted with 1 mL of toluene. After introducing 200 μL of ligands solution and vortexing, the colloidal NCs solution became cloudy. The treated NCs were washed with toluene and MeOH and finally redissolved into 100 μL of DMF to form a solution with a concentration of 30-40 mg/mL.
Two-Component Photosensitive NC Inks
Bare NCs with PAG Ligands.

To prepare starting materials, NCs were treated with $NOBF_4$ to obtain ligand-free bare NCs following the approach of Murray et al. (A Generalized Ligand-Exchange Strategy Enabling Sequential Surface Functionalization of Colloidal Nanocrystals. *J. Am. Chem. Soc.* 2011, 133, 998-1006.)

For example, $CeO_2$ NCs capped with organic ligands were diluted with toluene to form a stable solution with a concentration of 80 mg/mL. $NOBF_4$ used as a ligand stripping agent was first dissolved in DMF (20 mg/mL) and then introduced into the $CeO_2$ NC solution with the amount of 2:1 (NCs: $NOBF_4$) by weight. The precipitate was isolated by centrifugation and washed with toluene at least three times. The resulting $CeO_2$ NCs were purified using toluene and DMF for several precipitation-redispersion cycles. Purified NCs were dissolved in DMF at a concentration of ~40 mg/mL. The photosensitive ink was then prepared by mixing these $CeO_2$ NC colloids with different amounts of photosensitive molecules (2.5% by weight for DOLFIN and 15% for DELFIN) in a DMF and MeOH co-solvent system (v/v: 10:1). For different inks, such molecules could be (p-$CH_3$S—$C_6H_4$)($C_6H_5$)$_2$S$^+$OTf$^-$ (for DUV and DELFIN), N-hydroxynaphthalimide triflate (HNT, for i-line patterning and DELFIN), and diazonaphthoquinone (for h-line patterning).
Direct Patterning of Inorganic Materials.

The experiments were performed under yellow light, and photoactive inorganic inks were passed through a 0.2 μm filter before spin-coating to eliminate particulate contaminations. In this work, DOLFIN was used to obtain the patterns with submicron resolution, and DELFIN was used to obtain features with sub-100 nm resolution.

In a general DOFLIN procedure, the aforementioned photosensitive colloidal solutions were prepared in DMF with a concentration of about 30 mg/mL and spin-coated (spread: 400 rpm, 10 s; spin: 2000 rpm, 60 s) on various substrates (Si/$SiO_2$, Si, quartz, glass). The NC layers were then irradiated with either a 254-nm DUV lamp, a 365 nm i-line light, or a visible 405 nm h-line light through a chrome mask held together in a Mask Aligner system or using binder clips. The exposure dose and developer solvents varied, depending on the ligands. Typical parameters are listed in Table 1. Taking CdSe-DTC inks as an example, both DMF and acetone could be used to form NC ink. In order to obtain the NC layer from acetone with the same thickness as that from DMF solution, the concentration of NCs in acetone should be decreased to 10-15 mg/mL, due to the its higher volatility. A dose of 150-180 mJ/cm² was required for DUV lithography and 150 mJ/cm² was needed for 365 nm i-line patterning. Both neat DMF and acetone could be used as developer solvents in this case.

Additional Experimental Details

Chemicals.

Cadmium oxide (CdO, 99.5%, Aldrich), oleic acid (OA, 90%, Aldrich), selenium powder (Se, 100 mesh, 99.99% metal basis, Aldrich), trioctylphosphine oxide (TOPO, 90%, Aldrich), 1-octadecene (ODE, 90%, Aldrich), oleylamine (OLAm, 70%, Aldrich), tellurium shot (Te, 99.999%, Aldrich), tributylphosphine (TBP, 97% with isomers, Aldrich), gold (III) chloride hydrate (HAuCl4.xH2O, 99.999% trace metals basis, Aldrich), 1,2,3,4-tetrahydronaphthalene (tetralin, >97%, Aldrich), borane tert-butylamine complex (TBAB, 97%, Aldrich), carbon disulfide ($CS_2$, ACS reagent, ≥99.9%), ammonia solution ($NH_3$, 2.0 M in Methanol, Aldrich), n-propylamine (>99%, Aldrich), n-butylamine (99.5%, Aldrich), hydrazine ($N_2H_4$, anhydrous, 98%, Aldrich), trifluoroacetic acid (ReagentPlus®, 99%, Aldrich), ammonium sulfide solution (($NH_4)_2S$, 40-48 wt. % in $H_2O$, Aldrich), potassium sulfide ($K_2S$, anhydrous, min. 95%, Strem Chem), Potassium ethyl xanthogenate (PEX, 96%, Aldrich), 5-Mercapto-1-methyl-tetrazole (MTT, 98%, Aldrich), 1,3,4-Thiadiazole-2,5-dithiol (TDD, Aldrich), cerium oxide ($CeO_2$ NPs in toluene), aluminum oxide nanoparticles ($Al_2O_3$NPs, 20 wt. % in isopropanol, Aldrich), core-shell nanocrystals (CdSe/ZnS and InP/ZnS NCs in toluene, Nanosys, Inc.), (4-methylthiophenyl) methyl phenyl sulfonium triflate ((p-$CH_3$S—$C_6H_4$)($CH_3$)($C_6H_5$)$S^+OTf^-$, Aldrich), (4-methylthio phenyl) diphenyl sulfonium triflate ((p-$CH_3$S—$C_6H_4$)($C_6H_5)_2S^+$ $OTf^-$, Aldrich), N-hydroxynaphthalimide triflate (HNT, >99%, Aldrich), 1,2-naphthoquinonediazide-4-sulfonyl chloride (DNQ, 97%, Aldrich), nitrothiophene (85%, technical grade, Aldrich), tetramethylammonium hydroxide pentahydrate (>97%, Aldrich), benzyl cyanide (98%, Aldrich), hydrochloric acid (ACS reagent, 37%, Aldrich), magnesium sulfate (anhydrous, ReagentPlus®, ≥99.5%, Aldrich), diethyl ether (for analysis, Ethanol stabilized EMPARTA® ACS, Aldrich), petroleum ether (ACS reagent, Aldrich), ethyl acetate (anhydrous, 99.8%, Aldrich), trimethylamine (anhydrous, ≥99%, Aldrich), tetrahydrofuran (anhydrous, ≥99.9%, inhibitor-free, Aldrich), p-toluenesulfonyl chloride (reagent grade, ≥98%, Aldrich), potassium sulfide ($K_2$S, 95%, Strem), N,N-dimethylformamide (DMF, 99.8%, anhydrous, Aldrich), dimethylsulfoxide (DMSO, 99.8%, anhydrous, Aldrich), and propylene carbonate (PC, 99.7%, anhydrous, Aldrich) were used as received. N-methylformamide (NMF, 99%, Aesar) was dried with a molecular sieve before being used in a glovebox.

Nanocrystals Synthesis.

Organic ligand-passivated CdSe, CdTe, $CeO_2$, ZrO2, FePt, and Au NCs were synthesized following modified recipes from the published literature. (See, Wang, Y., et al., *Science* 2017, 357, 385; Panthani, M. G., et al., *Nano Lett* 2014, 14, 670.; Zhang, H., et al., *J. Am. Chem. Soc.* 2016, 138, 7464; Yu, T.; Joo, J.; Park, Y.; Hyeon, T. *Angew. Chem. Int. Ed.* 2005, 44, 7411; Joo. J. et al., *Journal of the American Chemical Society* 2003.125.6553; Lee, J., et al., *Journal of the American Chemical Society* 2010, 132, 6382; and Peng. S., et al., *Nano Res* 2008.1, 229.)

CdSe/CdS, CdSe/ZnS, and InP/ZnS core-shell QDs were either synthesized using established recipes or obtained from Nanosys Inc. (See, Dabbousi, B. O., et al., *Journal of Physical Chemistry B* 1997, 101, 9463; Peng. X., et al., *J. Am. Chem. Soc.*, 119, 7019; Talapin, D. V., et al., *J. Phys. Chem. B* 2004, 108, 18826; and Xie. R., et al., *J. Am. Chem. Soc.* 2007.129, 15432.)

ADC was synthesized using a method modified from Redemann, C. E. et al., *Organic Syntheses Collective*. Wiley: 1947; Vol. 3. 100 µL of $CS_2$ was slowly injected into 1.5 mL of $NH_3$ (2.0 M in MeOH) and stirred at 0° C. for 2 h. Then the colorless solution was moved to room temperature and stirred overnight in the dark. During this period, the mixture turned from colorless to a cloudy suspension. The ADC solid was then obtained through centrifugation and purified with acetone. The final product was redissolved into 3 mL of MeOH and stored in the dark in the refrigerator for further use.

Butyldithiocarbamate (Bu DTC) was obtained by mixing primary amine with carbon disulfide in a methanol or ethanol solution. (Dubois, F., et al., *Journal of the American Chemical Society* 2007, 129, 482.) In a typical reaction. $CS_2$ (1 mL, 17 mmol) and butylamine (1 mL. 10 mmol) were diluted into 3 mL and 1 mL of ethanol separately. Since the reaction was exothermic, a cooling system created by acetone and dry ice was required to provide a constant low temperature. Upon slowly adding the butylamine solution into $CS_2$ (1 mL/min) with strong stirring, a colorless solution was obtained. The reaction tube was kept at a low temperature for 15 min and then moved to an ambient condition, followed by another 30 min of stirring. The light-green solution was passed through the filter and dried under vacuum overnight to salvage unreacted precursors and unexpected side products. The white powder was then collected and stored in the dark in the refrigerator. Bu-DTC could also be prepared in methanol, acetone, or chloroform. If MeOH w as used instead of EtOH, a two-phase solution was obtained at the beginning since the $CS_2$ was immiscible in MeOH. Upon reacting with a primary amine such as butylamine, the $CS_2$ phase gradually disappeared with the formation of Bu-DTC in MeOH as a homogeneous light-green solution. If the reaction was not handled properly, e.g., performed under room temperature or mixed too quickly, then a violent reaction occurred and a yellow solution was observed, indicating that polysulfides as side products were generated. The polysulfide compounds could be attributed to the decomposition of DTC under high temperature and were hard to remove. Other primary-amine derivatives of dithiocarbamate were synthesized under the same general conditions, except for the reaction solvents. n-Propylamine and n-pentylamine were used to form the white slushy solid propyl dithiocarbamate (Pr-DTC) and pentyl dithiocarbamate (Pen-DTC) respectively. For simplicity, the DTC used in the manuscript refers Bu-DTC.

HCD synthesis was modified from a previous report. (See, Bellerby, J. M. *J. Hazard Mater* 1983, 7, 187.) 100 µL of $CS_2$ was slowly injected into a diluted $N_2H_4$ solution (200 µL of $N_2H_4$ in 2 mL of DMF) to form a light-yellow suspension. After stirring in the dark for 3 h, the suspension became a stable, yellowish-green solution. The HCD was precipitated out from the solution by adding 20 mL of toluene and collected as yellow droplets after the upper clear supernatant was discarded. The purified HCD was finally redissolved into MeOH and acetone cosolvents (v/v: 1:5) as a yellowish-green solution.

Ammonium 1,1 dithiooxalate (($NH_4)_2$DTO) was synthesized following a modified procedure described in Berra, C. M., G al., *Journal of the American Chemical Society* 2014, 136, 2192. By slowly mixing trichloroacetic acid (180 mg, 1.06 mmol) and a ($NH_4)_2$S solution (300 µL, 40-48 wt % in H$_2$O) in 1.5 mL of NMF, a yellow solution was obtained after stirring in the dark for 1 h. The (NH$_4$)$_2$DTO was then collected and dried as a light yellow solid after purifying by adding acetonitrile. Similar to the DTC ligand, the (NH$_4$)$_2$DTO was quite soluble in common polar solvents such as NMF and MeOH, was sensitive to DUV light, and thus could be directly used in the formation of photosensitive NCs inks. For simplicity, the DTO that was used refers to (NH$_4$)$_2$DTO. Besides (NH$_4$)$_2$DTO, other derivatives of dithiooxalate compounds could also be obtained in the same manner. For example, by using trichloroacetic acid and K$_2$S as the starting materials, potassium 1,1-dithiooxalate could be prepared.

MTT, PEX, and TDD were purchased from Sigma-Aldrich and directly used without any further purification.
Characterization of Photochemically Active NC Inks.

The integrity of NCs in DOLFIN inks were demonstrated with absorption spectra and TEM images. For example, the absorption spectra of PEX capped CdSe NCs resembled those capped with oleic acid, indicating the NCs preserved their electronic structure and size. Furthermore, a new feature, which could be assigned to the bound PEX ligands and appeared at 311 nm, was imposed on top of the absorption spectra of corresponding NCs. The slight red shift was evidence of the electrical coupling between ligands and NCs. Besides PEX, ADC, DTC-, DTO-, MTT- and TDD-ligands were also used to stabilize the CdSe NCs into colloidally stable inks. These ligands provided excellent colloidal stability for NCs in conventional solvents, and the absorption features of ADC, DTC, DTO, MTT and TDD were at around 291 nm, 288 nm, 340 nm, 245 nm, and 333 nm, respectively. This indicated that DUV light (254 nm) could trigger decomposition of all these ligands, and 365 nm photons could be used to lead the decomposition of TDD and DTO. Similar absorption behavior was observed in other NCs. As confirmed by TEM images, the NCs retained their size and morphology, except for a shorter inter-particle distance which was attributed to the replacement of bulky organic ligands with short photosensitive ligand constructs.

The electrostatic stabilization of NCs was evidenced by ζ-potential measurement, where negative values (−24.0, −19.6, −50.3, −38.5, −36.6, and −29.7 mV corresponding to ADC-DTC-, DTO-, MTT-, PEX-, and TDD-capped CdSe QDs in DMF) indicated that the binding of photosensitive ligands to the NC surface created an electrical double layer around each NC. The slight difference in ζ-potential measurement was presumably due to the different binding ability of ligands to NCs. For BF$_4^-$ stabilized NCs, positive ζ-potential was observed regardless of NC compositions, which was due to the weak binding affinity of the BF$_4^-$ itself to the positively charged surface metal centers.

In addition, the X-ray diffraction (XRD) patterns of treated CdSe NCs were identical to that of NCs capped with organic ligands. Peaks from other phases except CdSe were not observed, which indicated that no new phases were created after the ligand exchange, and crystal size remained unchanged. The completeness of ligand exchange was monitored with FTIR spectroscopy by depositing as-synthesized or treated NCs on KBr substrates. The absorption bands at 2800-3000 cm$^{-1}$ and 1300-1500 cm$^{-1}$ that arose from characteristic CH stretching and CH bending of original hydrocarbon ligands were drastically suppressed after the ligand exchange reaction.

Direct Patterning of Inorganic Materials
Instruments and Masks of the DOLFIN System.

The optical patterning was carried out in a clean room with an EVG semiautomatic double-sided mask aligner system or in ambient lab conditions using binder clips. For 365 nm i-line lithography, the internal UV light of a mask aligner was used as the light source, while for DUV patterning, the external light source was a low-pressure mercury vapor grid lamp (254 nm, 6.3 mW/cm$^2$) obtained from Jelight Company, Inc. For 405 nm h-line lithography, the external light source was obtained from ThorLabs, Inc. Masks with quartz substrates and chrome coatings were purchased from Front Range Photo Mask Co. The exposure dose used for patterning NC inks was compared to the exposure dose required for commercial organic photoresists.
Instruments of the EBL System.

The electron writing was performed in an FEI Nova NanoSEM 230 high resolution field emission SEM, equipped with a JC Nabity Nanometer Pattern Generation System (NPGS 9.0). The exposure dosage used for patterning NCs inks was compared to those of commercial electron resists such as PMMA, ZEP, and HSQ. (Gangnaik, A. S.; Georgiev, Y. M.; Holmes, J. D, *Chemistry of Materials* 2017, 29, 1898.)
Structural and Optical Characterization.

TEM images were obtained using a 300 kV FEI Tecnai F30 microscope. The high-resolution Field-Emission Scanning Electron Microscope (FE-SEM) analysis was carried out on a Carl Zeiss Merlin microscope operating at 5 kV. Wide-angle PXRD patterns were collected using a Bruker D8 diffractometer with a Cu Kα X-ray source operating at 40 kV and 40 mA. The UV-vis absorption spectra were collected using a Cary 5000 UV-Vis-NIR spectrophotometer. FTIR spectra were acquired in transmission mode using a Nicolet Nexus-670 FTIR spectrometer. The samples were prepared by drop-casting and concentrating NC dispersions on KBr crystal substrates (International Crystal Laboratories) and then dried at 100° C. (for DMF and NMF solutions). IR absorbance was normalized to the weight of the NCs deposited per unit area of the substrate. Thermogravimetric analysis (TGA) measurements were performed by using TA Instruments SDT Q600 thermal analyzer flow in the temperature range of 30-600° C. with a heating rate of 5° C./min and cooling rate of 5° C./min under N$_2$. Inductively coupled plasma optical emission spectroscopy (ICP-OES) analysis was carried out using an Agilent 700 Series spectrometer. Samples were digested by aqua regia (HNO$_3$, ≥69.0%, Trace SELECT, for trace analysis; HCl, ≥37%, TraceSELECT, for trace analysis, fuming; Sigma Aldrich) in a plastic container, following by deionized water dilution. DLS and ζ-potential data were collected using a Zetasizer Nano-ZS (Malvern Instruments, UK). Colloidal solutions were placed into a quartz cuvette assembly with a dip-cell Pd electrode, through which an electric field was applied to the solution. Profilometry measurements were carried out in a clean room using a Bruker Dektak XT-S profilometer. Films were prepared by spin-coating an NC solution on Si/SiO$_2$ in a glovebox equipped with a yellow filter. Ellipsometry measurements were performed by using a Gaertner Waferskan automated ellipsometer to map the thickness and reflective index of patterned oxide layers on top of Si/SiO$_2$ or Si substrates.

Numerical Evaluation of the Interaction Potential Between Colloidal NCs (DLVO).

The electrostatic double-layer interaction between two spherical particles in a dilute electrolyte solution is obtained by solving the Poisson-Boltzmann equation $$\nabla^2 \cdot \psi = \kappa^2 \sinh\left(\frac{e\psi}{kT}\right),$$

where $\Psi$ is the spatially dependent electric potential, and $\kappa^{-1}$ is the Debye length. Since this differential equation does not have an analytical solution, certain simplifying approximations are typically used to produce a closed-form expression for the electric potential. This includes the Derjaguin approximation (DA), the linear Poisson-Boltzmann approximation (LPB) and the linear superposition approximation (SLA). Each of these approximations are only valid for a specific range of parameters, e.g. low surface potentials, small Debye length, large particle radius, etc. For bare $CeO_2$ NCs in DMF, the Debye length, particle size, and particle separation all fall in the same length scales (several nanometers), yet surface potential is relatively high (>50 mV). In this scenario, a numerical approach is required for accurate evaluation of the electrostatic interaction potential.

The computation script (DLVO_numerical_full.m) was based on prior literature but written to utilize the "pdenonlin" function, which is part of the MATLAB partial differentiation toolbox. (See, Carnie, S. L. et al., *Journal of Colloid and Interface Science* 1994, 165 (1), 116-128; Hoskin, N. et al., *Philosophical Transactions of the Royal Society of London. Series A, Mathematical and Physical Sciences* 1956, 248 (951), 449-466, and Hoskin, N. et al., *Philosophical Transactions of the Royal Society of London. Series A, Mathematical and Physical Sciences* 1956, 248 (951), 433-448.) Briefly, the electrostatic potential around two constant potential spheres was first evaluated using the "pdenonlin" function for a range of surface separations. The force between the particles was calculated by integrating the stress tensor across a hemisphere with the median plane as the base. The electrostatic interaction energy at each surface separation was determined by integrating the force from a separation far enough (where the force is close to zero) to that point. Finally, this electrostatic energy was combined with the van der Waals attractive energy to give the total interaction energy (DLVO) curve.

The parameters relevant to the scenario described here were plugged in. These were based on either measured or literature values: the $CeO_2$ NC radius was measured by SAXS, the surface potential (100 mV) was approximated based on zeta-potential measurements (~50 mV), and the Hamaker constant was found in the literature. (See, Faure, B. et al., *Science and Technology of Advanced Materials* 2013, 14 (2), 023001.) The results of the calculations were compared to approximating solutions for both 0.001 M salt concentration and high 1 M salt concentration. Then, the van der Waals, electrostatic, and total (DLVO) interaction energies between two spheres were plotted for both cases. Finally, the total interaction energies for both 0.001 M and 1 M salt concentrations were multiplied by a factor of 8 and plotted together. The factor of 8 was chosen based on the number of nearest and near-touching (~10-20% away) neighbors in a random sphere packed solid.

Decomposition Pathways of Photosensitive Ligands in One-Component Systems.

ADC.

FTIR spectroscopy was used to analyze both ADC and its photodecomposition products. The FTIR spectra of as-synthesized ADC matched the characteristic peaks for the ammonium ion, $NH_4^+$ (N—H bend: 1400 $cm^{-1}$; N—H stretch: 3140 $cm^{-1}$, broad) and the dithiocarbamate anion, $H_2NCS_2^-$ (N—H primary amine bend: 1590 $cm^{-1}$; N—H stretch: 3402 $cm^{-1}$; C—N stretch: 1322 $cm^{-1}$). Upon irradiation, the N—H and C—N peaks from the anion disappeared, which was concurrent with the appearance of the characteristic thiocyanate stretch at 2046 $cm^{-1}$. This process was also corroborated with ESI-MS measurements, which showed that the dithiocarbamate anion (m/z=92) in the ADC solution was replaced by the thiocyanate anion (m/z=58) after DUV irradiation.

Bu-DTC.

From ESI-MS measurement, it was found that both the Bu-DTC anion ($BuNH_2CS_2^-$) and the butylammonium anion ($Bu-NH_3^+$) were present, which confirmed that the composition was butylammonium butyldithiocarbamate. Upon DUV irradiation, the Bu-DTC anion peaks disappeared, but the butylammonium ions remained. This was consistent with the decomposition of Bu-DTC into butylamine and carbon disulfide.

MTT.

The decomposition of the MTT ligand was investigated via ESI-MS and $^{13}C$ and $^1H$ NMR. ESI-MS results showed the presence of the m/z=115 negative ion of the MTT compound before irradiation. However, after irradiation, many new peaks in positive ESI-MS appeared (m/z=145, 173, 195, 205, 237). Further studies from NMR measurements further confirmed that the five-membered ring from the original MTT ligand disappeared right after DUV irradiation. Therefore, the photodecomposition mechanism could be deduced as the loss of $N_2$ to form a cyclic intermediate, followed by the release of S to form the final product.

PEX.

The ability to pattern PEX-capped NCs with much lower DUV dosages indicated a different patterning mechanism compared to the other ligands. Analysis with $^1H$ NMR, ESI-MS and FTIR failed to reveal any decomposition products, which was attributed to their high volatility. Hence, an investigation involving elemental analysis was further pursued.

To mimic the NC-PEX surface, cadmium ethyl xanthate, $Cd(CH_3CH_2OCS_2)_2$, or $Cd(EX)_2$ were synthesized by precipitating cadmium chloride ($CdCl_2$) with PEX in $H_2O$. When $Cd(EX)_2$ was redissolved in DMF (50 mg/mL) and irradiated with DUV light, the precipitate that formed had a Cd: S ratio of 1:1.2 (by ICP-OES), which suggested the formation of CdS. (As a control, the Cd:S ratio in $Cd(EX)_2$ was found to be 1:3.7.) Hence, the patterning mechanism was deduced as the decomposition of Cd-PEX into CdS on the NC surface, with the release of gaseous products.

TDD.

Based on FTIR, ESI MS, and NMR analyses, the photopatterning mechanism with TDD did not involve photodecomposition into smaller products. Instead, a thiol-thione to thiol-thiol phototautomerization mechanism induced by DUV or 365 nm light was proposed. It is hypothesized that this conversion of TDD into its dithiol form allows it to bind with two NCs, leading to a reduction in solubility.

When TDD was dissolved in methanol, the anions were clearly observed using ESI-MS in the negative mode (m/z=149). $^{13}C$ NMR showed the presence of only one peak at 176 ppm (due to rapid conversion between tautomers) and was close to previously reported measurements (Wiley: 172 ppm, $DMSO-d_6$). FTIR peaks of solid TDD could be assigned with the following relevant measurements: N—H (~3000 $cm^{-1}$: stretch, overtones, Fermi resonances; 1414 $cm^{-1}$: deformation), S—H (2480 $cm^{-1}$: stretch; 940 $cm^{-1}$: deformation) and thiadiazole ring stretches (1241 $cm^{-1}$, 1123 $cm^{-1}$, 1083 $cm^{-1}$, 1051 $cm^{-1}$, 716 $cm^{-1}$). Also, the UV-spectrum of TDD showed a peak at about 350 nm, which was attributed to the thione form of TDD.

Upon DUV or 365 nm irradiation, the 350 nm absorption peak was significantly diminished, and the $TDD^-$ anions were no longer observed from ESI-MS, which could be explained by either decomposition or polymerization of TDD molecules. (Polymerizing TDD would bleach the 350 nm absorption because it would lock the molecule in the thiol form). However, both FTIR and $^{13}$C NMR confirmed the later chemical transformation pathway. FTIR spectroscopy showed that after DUV irradiation, absorptions from both N—H and S—H bonds were bleached, while those from the thiadiazole ring were mostly unchanged or only slightly shifted. Furthermore, these peaks matched up with peaks from the annealing of TDD at 150° C. (slightly below its melting point), which more clearly showed S—S stretching absorption at 525 cm$^{-1}$. The broadening of the irradiated TDD spectrum compared to the annealed TDD spectrum could be rationalized as the higher disorder in the photo- versus the thermally-induced process. Also, $^{13}$C NMR showed a shift in the carbon ring resonance to 149 ppm, consistent with ChemDraw predictions of the photo-induced tautomerization. In short, TDD undergoes a photo-induced tautomerization under UV irradiation. The formation of the dithiol allows it to polymerize with one another or bridge NCs.

Equation 1. Reaction of DNQ in DMF (Hall, H. K. J. *Journal of the American Chemical Society* 1956, 78, 2717.)

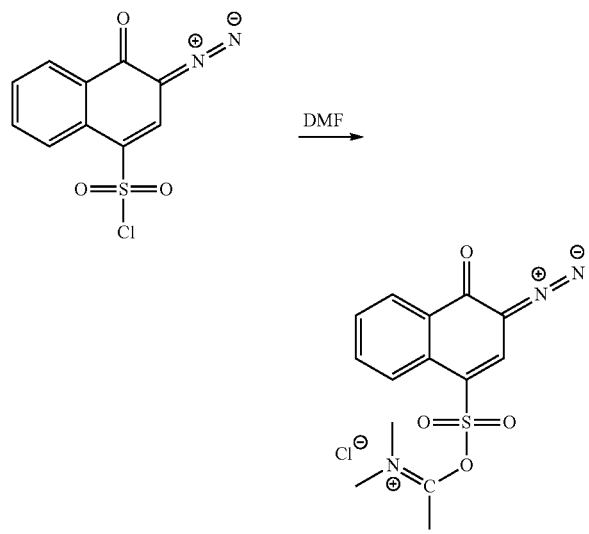

Equation 2. EB-induced radical reaction of PAGS.

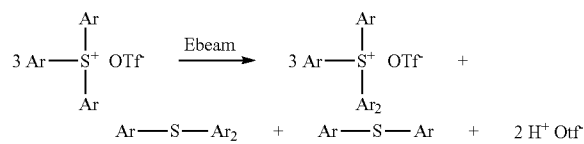

Example 2

This example illustrates a method of making a photopatternable film comprising charge-balanced CdSe nanocrystals and PAGs.

Ligand Preparation.

In this example, carbamate salt anions were used as charge-balancing ligands. The carbamate salts were obtained by mixing primary amine with dry ice at 0° C. Using propyl-carbamate as an example, propylamine was slowly added into excess dry ice under an ice bath, generating a white slurry solid in minutes. The final product was purified by vacuum at room temperature, during which the excess dry ice was removed by forming $CO_2$ gas. The white powder was then collected and stored in the dark in a refrigerator. Other primary-amine derivative carbamate salts were synthesized under the same general conditions, except for the primary amine precursors used as the starting material. n-Butylamine and n-hexylamine were used to form the white butyl carbamate (Bu-DCO) and hexyl carbamate (Hex-DCO) salts respectively. For simplicity, "DCO" is used below to refer to the Pr-DCO.

NC Inks Preparation.

The DCO based NC inks were prepared through a two-step ligand exchange process. Oxo ligands are less nucleophilic than other inorganic anions such as MCCs, chalcogenides, and halides. As a result, directly replacing organic ligands through a phase transfer procedure with oxo ligands is challenging. Therefore, preparation of the DCO-NC inks involved two steps: removal of organic ligands from pristine NCs and reattachment of DCO ligands to a "bare" NC surface.

To prepare the starting materials, the CdSe NCs were treated with $NOBF_4$ to obtain ligand-free bare NCs following the approach of Dong et al. (Dong, A., et al., *J. Am. Chem. Soc.* 2011, 133, 998.) For example, organic ligand-capped CdSe NCs were diluted by toluene to form a stable solution with a concentration of 35 mg/mL. Chlorobenzene could also be used for the dilution. $NOBF_4$, which was used as a stripping ligand, was first dissolved in DMF (20 mg/mL) and then introduced into the CdSe NC solution at a ratio of 2:1 (NCs:$NOBF_4$) by weight. The precipitate was isolated by centrifugation and washed by toluene at least three times. The resulting CdSe NCs were purified using toluene and DMF for several precipitation-redispersion cycles. The purified NCs were dissolved in DMF at a concentration of ~35 mg/mL. Examples of stripping agents, other than $NOBF_4$, that can be used include other tetrafluoroborate salts (e.g. $Et_3OBF_4$), metal triflate salts (e.g. $Zn(OTf)_2$, $Cd(OTf)_2$), metal nitrate salts (e.g. $Zn(NO_3)_2$, $In(NO_3)_2$), sulfate salts, and phosphate salts.

The DCO-capped NCs were prepared by adding the DCO ligand solution to the ligand-free bare NCs at a concentration of 20 mg/mL and a ratio of 2:1 (NCs: DCO) by weight. The precipitate was isolated by centrifugation and washed by DMF once. The purified NCs were dissolved in toluene at a concentration of ~35 mg/mL. The photosensitive inks were then prepared by mixing such DCO-capped CdSe NCs with a certain number of photosensitive molecules (2.5% by weight for DOLFIN) in toluene and a MeOH co-solvent system (v/v: 10:1). The PAGs used were the non-ionic PAG 2-(4-methoxystyryl)-4,6-bis(trichloromethyl)-1,3,5-triazine, which was used to make a patterned film using DOLFIN; p-$CH_3$S—$C_6H_4$)($C_6H_5$)$_2$S$^+$OTf$^-$, which can be patterned using DUV radiation; N-hydroxynaphthalimide triflate, which can be patterned using i-line and DELFIN; and diazonaphthoquinone, which can be patterned using the visible h-line. Examples of solvents, other than toluene, that can be used include O-xylene, chlorobenzene, and dichlorobenzene.

Photo Patterning of Carbamate Based NCs Inks.

Since the carbamate ligands have no absorption features in the UV light range, the PAGs were added to make photopatternable inks. The 2-(4-methoxystyryl)-4,6-bis(trichloromethyl)-1,3,5-triazine PAG releases HCl upon irradiation by 365 nm light, which serves as stripping ligands to remove the carbamates. The NCs preserved their bright PL after patterning, which can be attributed to the bonding between NC surface and Cl$^-$ anion from PAG.

Example 3

This example illustrates a method of making a photopatternable film comprising a non-ionic PAG that is photosensitive to blue light (450 nm).
Synthesis of 450 nm Photon Sensitive PAG.

2-phenyl-2-(-5 ((tosyloxy)imino)thiophen-2-ylidene)acetonitrile (PTA) was synthesized based on previous work. (See, Suwinaski, J. et al., *Journal of Heterocyclic Chemistry* 2003, 40 (3), 523-528 and Xie Xiao-Yan, P. Y.-L. et al., *Imaging Science and Photochemistry* 2013, 31 (4), 305-315.) In the first step, 5-(hydroxyimino)thiophen-2-ylidene)-2-phenylacetonitrile was prepared and used as precursor. Nitrothiophene (645 mmol, 5 mmol) and tetramethyl hydroxide (3 g) were dissolved in methanol (20 mL) at room temperature followed by adding phenyl acetonitrile (1.15 mL, 10 mmol). After 3 hours, the resulting mixture was then acidified by concentrated hydrochloric acid until the pH reached 5. The mixture was diluted by 50 mL of cold water and extracted three times with chloroform. The combined extracts were mixed with magnesium sulfate (VI) to remove residual water and were further evaporated at 50° C. under slightly diminished pressure to remove excess solvents. Anhydrous diethyl ether (60 mL) was added to the slushy residue, and the resulting solution was filtered and evaporated at 35° C. under slightly diminished pressure. The crush product was mixed with dichloromethane and silica gel and then purified by using thin-layer chromatography (TLC), which used silica gel as the stationary phase and petroleum ether and ethyl acetate mixture solvents as the mobile phase (4:1 by vol). The brown product was obtained with a yield of 42%.

Figure 11A:
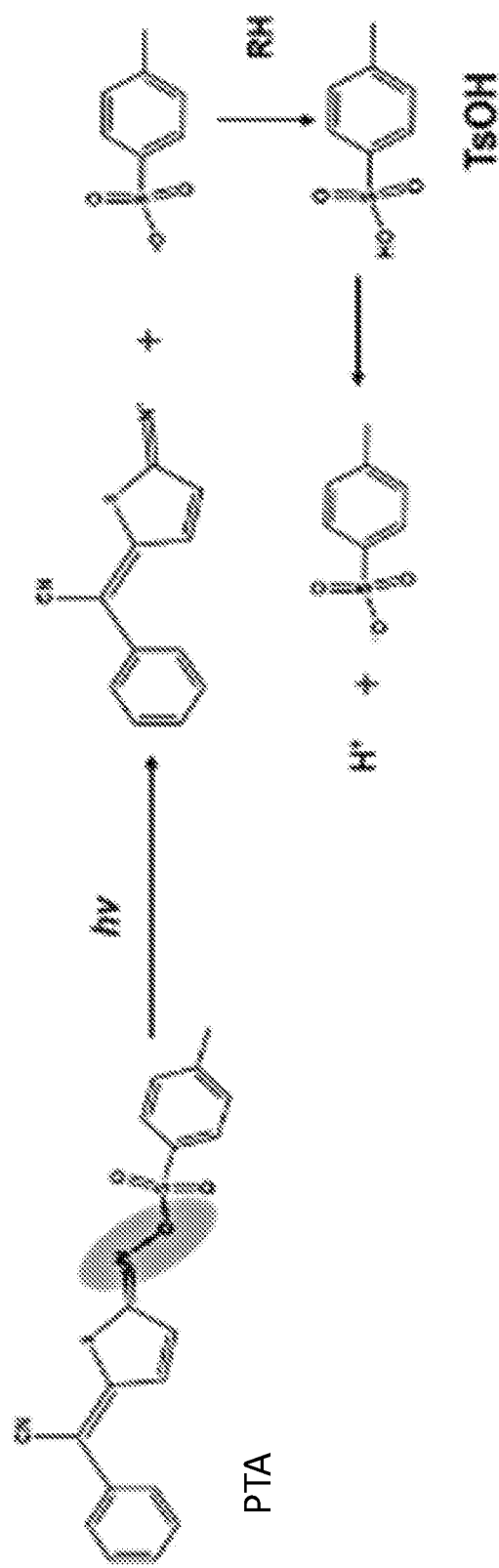
FIG. 11A. Possible mechanism of the reaction of the photodegradation process.
Figure 11B:
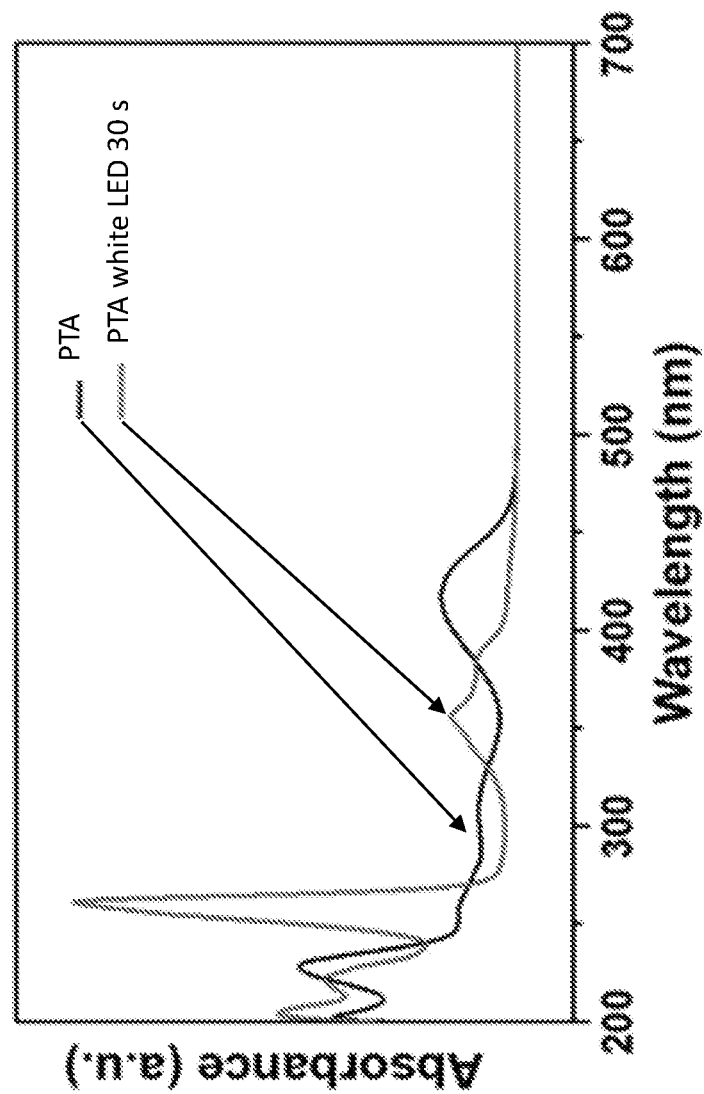
FIG. 11B. UV-Vis absorption of PTA in MeOH before and after white LED exposure.
Figure 11C:
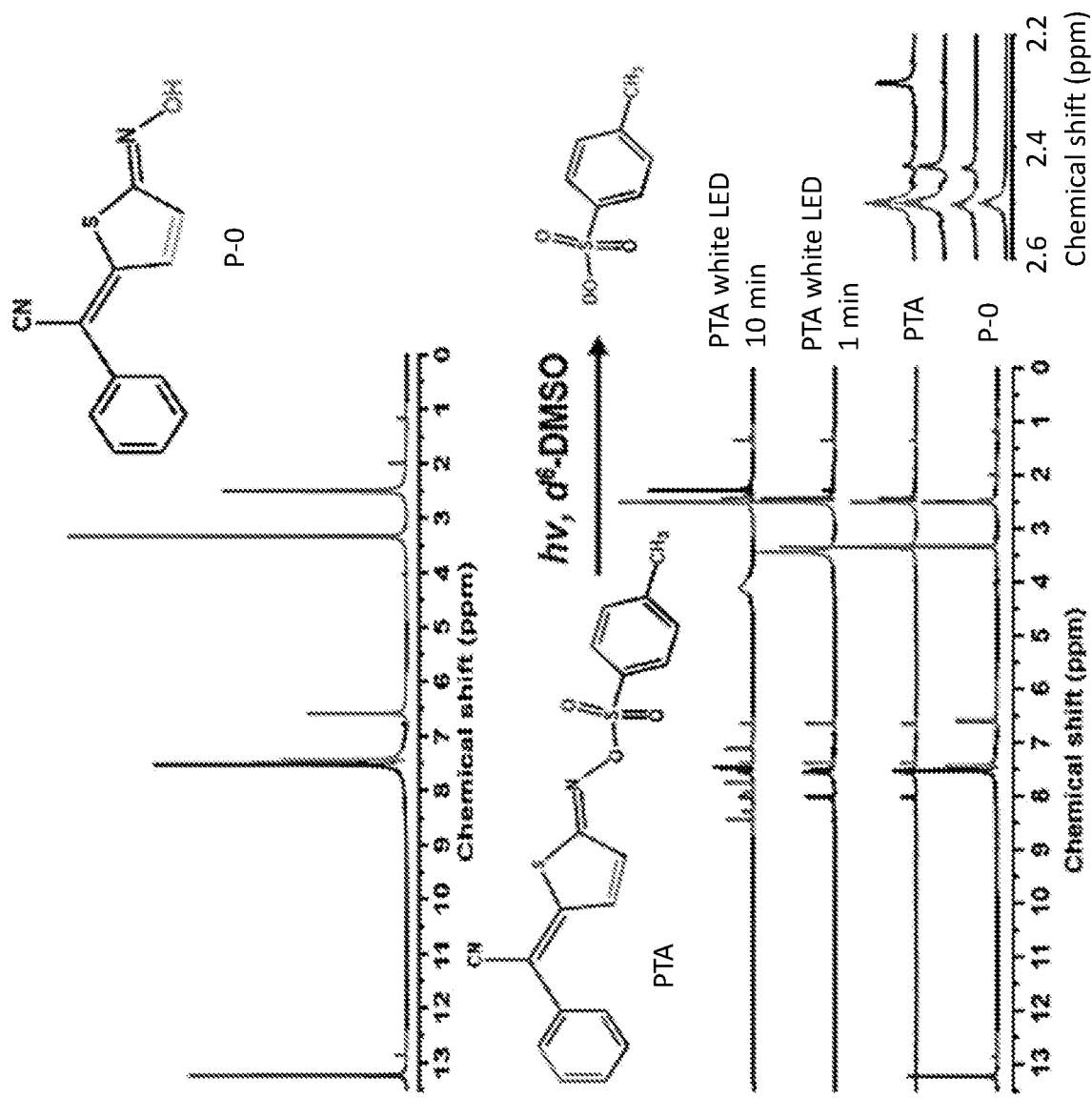
FIG. 11C. $^1$H-NMR of P-0 (top) and PTA before and after white LED exposure (bottom, the inset shows peak details between 2.2 and 2.4 ppm, suggesting the photon efficiency of PTA).
Figure 14:
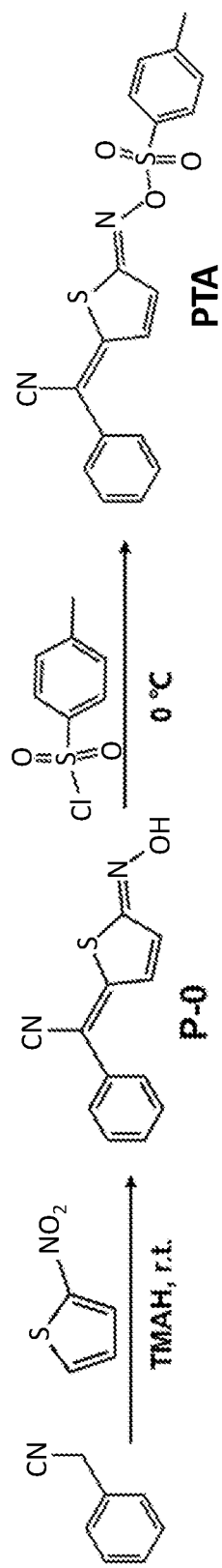
FIG. 14 depicts two-step synthesis of the non-ionic PAG, PTA.

In the second step, as synthesized 5-(hydroxyimino)thiophen-2-ylidene)-2-phenylacetonitrile (140 mg, 0.5 mmol) and triethylamine (250 µL) were dissolved in tetrahydrofuran (1.5 mL). In the ice bath, p-toluenesulfonyl chloride (95 mg, 0.5 mmol) dissolving in tetrahydrofuran (500 µL) was added dropwise into the aforementioned solution. After 3 hours, the solution was poured into excess water and the precipitated black particles were collected and re-dissolved in THF or toluene and washed with water three times. The product, 2-phenyl-2-(-5-((tosyloxy)imino)thiophen-2-ylidene)acetonitrile (FIG. 14) was dried in vacuum with a yield of 34%.
Photochemistry Study of PTA A proposed mechanism for the photodegradation process for PAG PTA, is shown in FIG. 11A. The results of UV-Vis absorption and $^1$H-NMR studies of PTA are provided in FIGS. 11B and 11C, respectively.

Figure 12A:
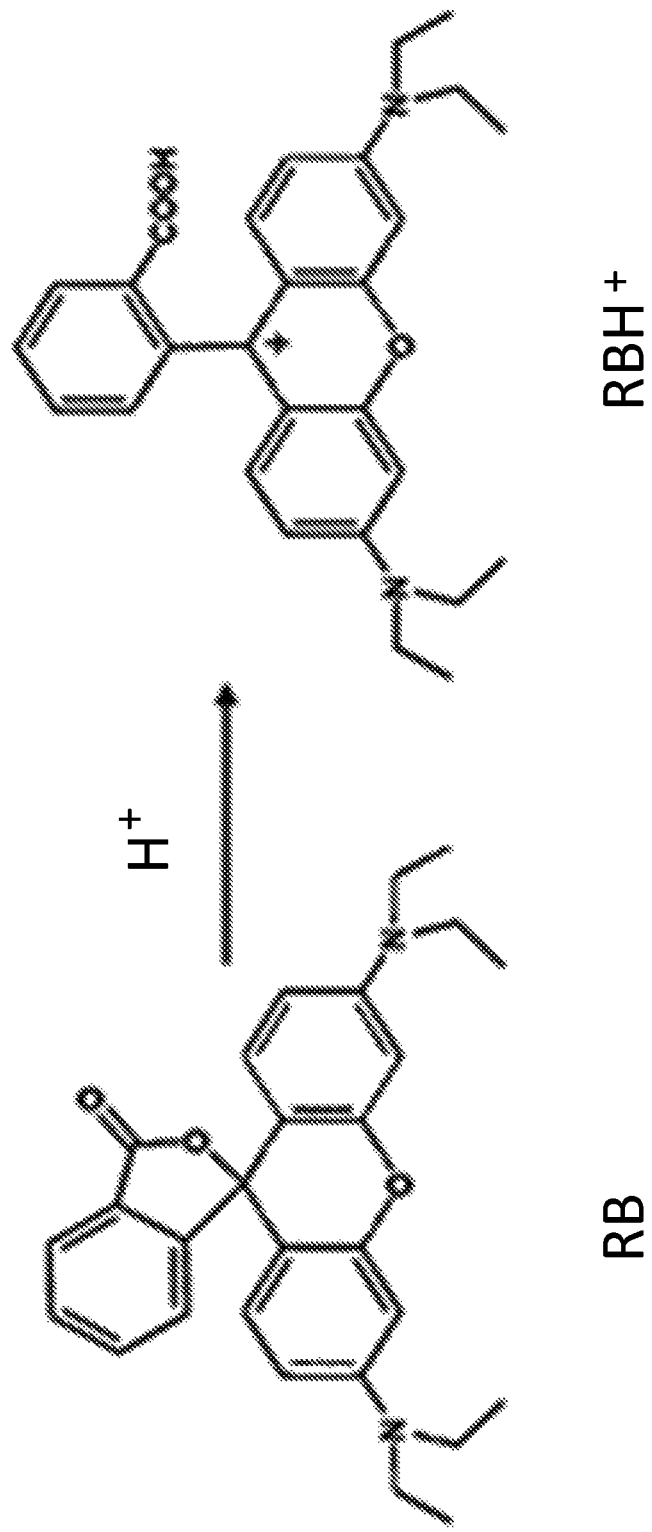
Figure 12B:
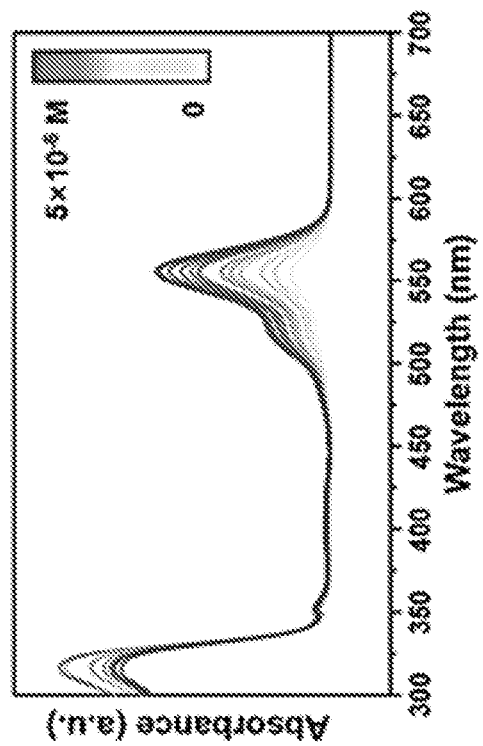
(FIG. 12B) RB with different amount of salicylic acid in acetonitrile.
Figure 12D:
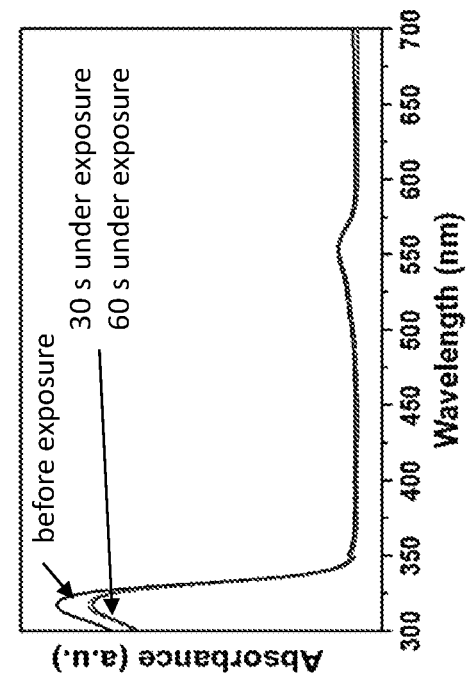
(FIG. 12D) RB in acetonitrile before and after 450 nm photons exposure (control experiment).
Figure 12C:
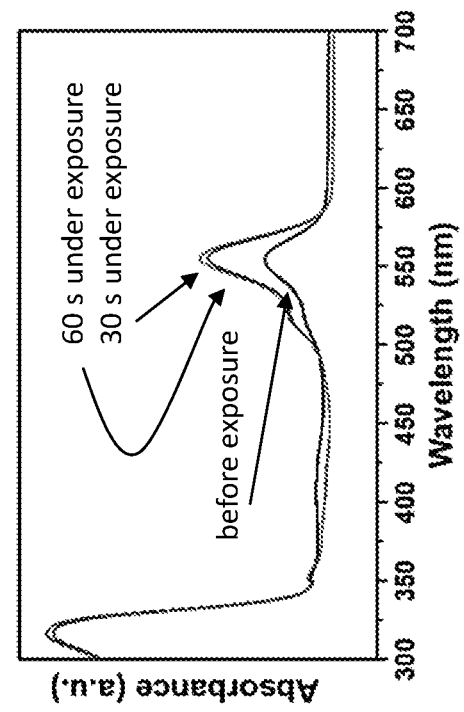
(FIG. 12C) PTA and RB in acetonitrile before and after 450 nm photons exposure.

The structure of RB in its unprotonated and protonated forms are shown in FIG. 12A. UV-Vis absorption studies of RB as an acid sensitive indicator are shown in FIGS. 12B-12D.
Two-Component Photosensitive NC Inks
CdSe-Capped with Oleate Ligands Exchanged with $AsS_3^{3-}$ Ligands Using CdSe NCs (4.5 nm, wurtzite phase) as an example, 100 µL of the as-synthesized NCs (30 mg/mL) was first diluted into 1 mL of toluene. After adding 100 µL of fresh $K_3AsS_3$ solution in NMF (0.5 M) and vortexing for 1 min, the red colloidal solution turned into a cloudy NC suspension. The solid was collected by centrifugation and redissolved into NMF. The treated NCs were purified using NMF and toluene for several precipitation-redispersion cycles. The purified CdSe—$AsS_3^{3-}$ NCs were redissolved into 150 µL of NMF and DMF co-solvent system (v/v: 1:2) with a concentration of 15-20 mg/mL.

NCs Capped with Two-Component Ligand System: $AsS_3^{3-}$ (Stabilizing Ligand) and Photosensitive Non-Ionic PAG PTA.

The photosensitive ink was prepared by mixing the $AsS_3^{3-}$ capped CdSe NC colloids with different amounts of PTA (4-16% by weight) in DMF. Typically, 50 µL of CdSe—$AsS_3^{3-}$ NCs were mixed with 10 µL of PTA (20 mg/mL) to form a stable yellow-brown solution.
Direct Patterning of Films.

Figure 13:
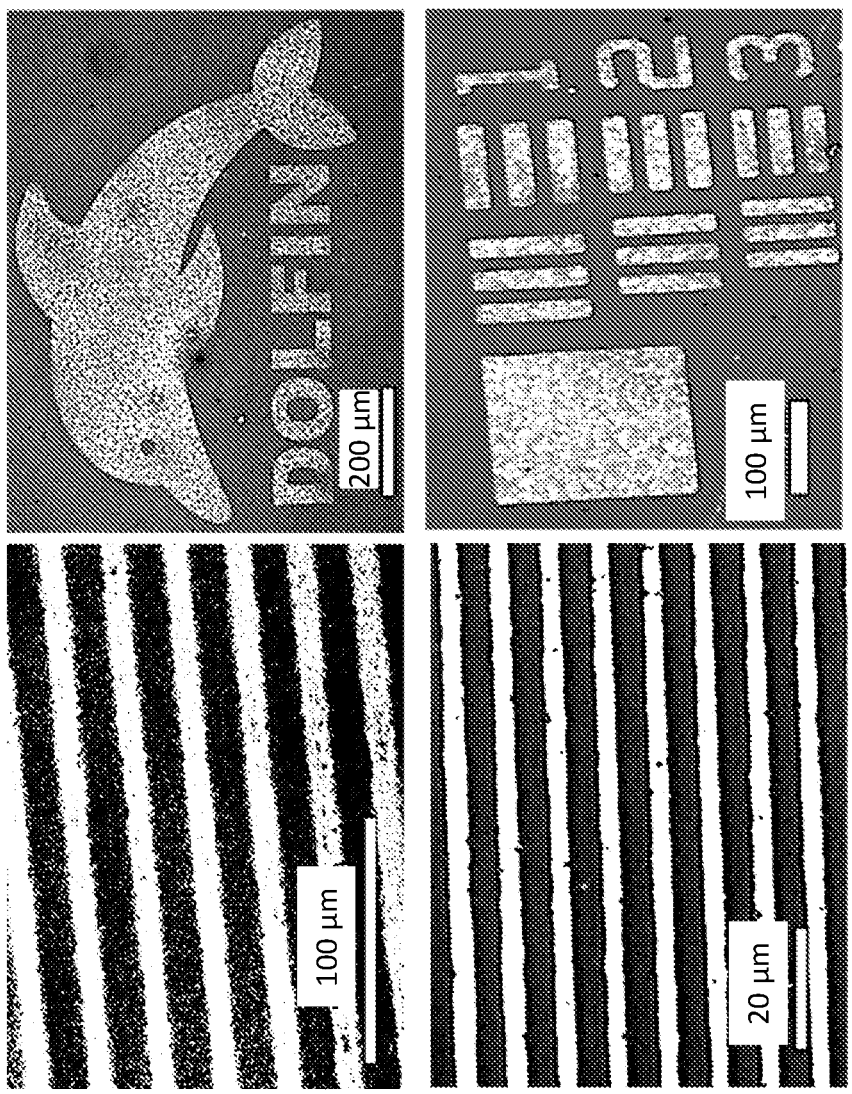
FIG. 13. Optical lithography of CdSe NCs using blue LED and white LED (30 s for the exposure time).

Patterning experiments were performed under yellow light, and the photosensitive inorganic inks were centrifuged before spin-coating to eliminate undissolved particles. In a general DOFLIN procedure, photosensitive colloidal solutions were prepared in DMF with a concentration of about 20 mg/mL and spin-coated (spread: 1000 rpm, 10 s; spin: 2000 rpm, 60 s) on $SiO_2$ substrates. The coatings were then irradiated with either a blue LED (450 nm), or a white LED light through a chrome mask held together in a Mask Aligner system or using binder clips. A dose of 500 mJ/cm$^2$ was used for blue and white LED lithography. Neat NMF could be used as developer solvents in this case (for some cases, washing of the exposed substrate with TMAH is desirable before development). The resolution achieved was as small as 5 µm. (FIG. 13)

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. Ligand-capped inorganic crystals comprising:
   inorganic crystals, each crystal having a surface;
   alkyl carbamate anions bound to the surfaces of the inorganic crystals; and
   photosensitive cations or photosensitive non-ionic molecules associated with the inorganic crystals.

2. The ligand-capped inorganic crystals of claim 1, wherein the photosensitive cations or photosensitive non-ionic molecules are photoacid generators.

3. A solid film comprising the ligand-capped inorganic crystals of claim 1 on a substrate.

4. A method of patterning the film of claim 1, the method comprising:
   irradiating a first portion of the film with radiation, wherein the interaction between the radiation and the photosensitive cations or photosensitive non-ionic molecules results in the chemical modification of the film, while preventing a second portion of the film from being irradiated by the radiation; and
   contacting the film with a solvent that dissolves the second portion of the film, but not the first portion of the film.

5. Ligand-capped inorganic crystals comprising:
inorganic crystals, each crystal having a surface;
inorganic anions bound to the surfaces of the inorganic crystals; and
2-phenyl-2-(-5-((tosyloxy)imino)thiophen-2-ylidene) acetonitrile molecules associated with the inorganic crystals.

6. The ligand-capped inorganic crystals of claim 5, wherein the inorganic anions comprise metal halide anions.

7. A solid film comprising the ligand-capped inorganic crystals of claim 5 on a substrate.

8. A method of patterning the film of claim 7, the method comprising:
irradiating a first portion of the film with radiation, wherein the interaction between the radiation and the 2-phenyl-2-(-5-((tosyloxy)imino)thiophen-2-ylidene) acetonitrile molecules results in the chemical modification of the film, while preventing a second portion of the film from being irradiated by the radiation; and
contacting the film with a solvent that dissolves the second portion of the film, but not the first portion of the film.

9. Ligand-capped inorganic crystals comprising:
inorganic crystals, each crystal having a surface;
inorganic anions bound to the surfaces of the inorganic crystals; and
1,2-naphthoquinonediazide-4-sulfonyl chloride molecules associated with the inorganic crystals.

10. The ligand-capped inorganic crystals of claim 9, wherein the inorganic anions comprise metal halide anions.

11. A solid film comprising the ligand-capped inorganic crystals of claim 9 on a substrate.

12. A method of patterning the film of claim 11, the method comprising:
irradiating a first portion of the film with radiation, wherein the interaction between the radiation and the 1,2-naphthoquinonediazide-4-sulfonyl chloride molecules results in the chemical modification of the film, while preventing a second portion of the film from being irradiated by the radiation; and
contacting the film with a solvent that dissolves the second portion of the film, but not the first portion of the film.

13. The ligand-capped inorganic crystals of claim 1, wherein the alkyl carbamate anions are selected from butyl carbamate anions, propyl carbamate anions, pentyl carbamate anions, hexyl carbamate anions, and octyl carbamate anions.

14. The ligand-capped inorganic crystals of claim 1, comprising the photosensitive cations associated with the inorganic crystals.

15. The ligand-capped inorganic crystals of claim 1, comprising the photosensitive non-ionic molecules associated with the inorganic crystals.

16. The ligand-capped inorganic crystals of claim 1, wherein the alkyl carbamate anions do not absorb radiation in the ultraviolet range of the electromagnetic spectrum.

17. The ligand-capped inorganic crystals of claim 5, wherein the inorganic anions comprise metal chalcogenide anions.

18. The ligand-capped inorganic crystals of claim 9, wherein the inorganic anions comprise metal chalcogenide anions.

* * * * *